(12) United States Patent
Pillai

(10) Patent No.: US 6,212,216 B1
(45) Date of Patent: Apr. 3, 2001

(54) EXTERNAL CAVITY MICRO LASER APPARATUS

(76) Inventor: Ramadas M. R. Pillai, 20 W. 17th Pl., Lombard, IL (US) 60148

( * ) Notice: Subject to any disclaimer, the term of this patent is extended or adjusted under 35 U.S.C. 154(b) by 0 days.

(21) Appl. No.: 08/767,721

(22) Filed: Dec. 17, 1996

(51) Int. Cl.$^7$ .................................................. H01S 3/08
(52) U.S. Cl. ............................ 372/96; 372/99; 372/108; 385/31; 385/10; 385/37
(58) Field of Search .................. 372/6, 29, 96, 372/108, 99; 385/10, 31, 33, 37

(56) References Cited

U.S. PATENT DOCUMENTS

| | | | |
|---|---|---|---|
| 4,214,216 | 7/1980 | Jones, Jr. | 331/94.5 C |
| 4,246,548 | 1/1981 | Rutz | 331/94.5 H |
| 4,503,541 | 3/1985 | Weller et al. | 372/50 |
| 4,504,950 | 3/1985 | AuYeung | 372/20 |
| 4,583,226 | 4/1986 | Liou | 372/19 |
| 4,689,797 | 8/1987 | Olshansky | 372/45 |
| 4,730,325 | 3/1988 | Chow | 372/44 |
| 4,809,288 | 2/1989 | Welch et al. | 372/46 |
| 4,852,113 | 7/1989 | Botez | 372/50 |
| 4,866,724 | 9/1989 | Botez et al. | 372/50 |
| 4,995,047 | 2/1991 | Hadley et al. | 372/50 |

(List continued on next page.)

OTHER PUBLICATIONS

PCT International Search Report; PCT/US97/18247, dated Feb. 23, 1998.
Bogatov et al., "Injection Laser with an Unstable Resonator", Sov. J. Quantum Electron 10(5), May 1980, pp. 620–622.
Chang–Hasnain et al., "Characteristics of the Off–Centered Apertured Mirror External Cavity Laser Array", Appl. Phys. Lett. 54(6), Feb. 6, 1989, pp. 484–486.
Chang–Hasnain et al., "Diffraction–Limited Emission from a Diode Laser Array in an Apertured Graded–Index Lens External Cavity", Appl. Phys. Lett. 49(11), Sep. 15, 1986, pp. 614–616.
Chang–Hasnain et al., "High Power with High Efficiency in a Narrow Single–Lobed Beam from a Diode Laser Array in an External Cavity", Appl. Phys. Lett. 50(21), May 25, 1987, pp. 1465–1467.
D'Amato et al., "Coherent Operations of an Array of Diode Lasers Using a Spatial Filter in a Talbot Cavity", Appl. Phys. Lett. 55(9), Aug. 28, 1989, pp. 816–818.

(List continued on next page.)

*Primary Examiner*—Teresa M. Arroyo
*Assistant Examiner*—Quyen Phan Leung
(74) *Attorney, Agent, or Firm*—Loyal McKinley Hanson

(57) ABSTRACT

External cavity micro laser apparatus comprises at least one multimode micro laser having an emission aperture with a relatively long dimension lying in a slow axis plane and a relatively short dimension lying in a fast axis plane. The laser produces multiple transverse lasing modes, the multiple modes having multiple lasing lobe components. External cavity means embracing the laser has an output section including spatial filter means, which may be the input aperture of an optical waveguide, for effectively selecting at least one of the transverse lasing lobe components. The cavity output section includes imaging means for imaging at the spatial filter means a far field spatial frequency distribution in the slow axis plane of the emission aperture, at which distribution the lasing lobe components are spatially distinguishable. The cavity output section also includes feedback means for causing a fraction of the optical energy in the selected lasing lobe component(s) to be fed back to the laser for amplification by the laser. A cavity return section receives the amplified lasing lobe component after reflection from the laser. Return means in the return section efficiently returns to the laser means at least a portion of the amplified and reflected lasing lobe component.

61 Claims, 13 Drawing Sheets

U.S. PATENT DOCUMENTS

| | | | |
|---|---|---|---|
| 4,995,050 | 2/1991 | Waarts et al. | 372/95 |
| 5,012,483 | 4/1991 | Reintjes et al. | 372/95 |
| 5,018,831 | 5/1991 | Wyatt et al. | 350/162.17 |
| 5,027,359 | 6/1991 | Leger et al. | 372/18 |
| 5,033,054 | 7/1991 | Scifres et al. | 372/50 |
| 5,050,180 | 9/1991 | Botez et al. | 372/45 |
| 5,063,570 | 11/1991 | Botez et al. | 372/50 |
| 5,163,058 | 11/1992 | Farries et al. | 372/6 |
| 5,179,548 | 1/1993 | Sandesara | 370/16.1 |
| 5,272,711 | 12/1993 | Mawst et al. | 372/45 |
| 5,297,154 | 3/1994 | Heidemann et al. | 372/6 |
| 5,299,219 | 3/1994 | Hayakawa | 372/50 |
| 5,319,659 | 6/1994 | Hohimer | 372/45 |
| 5,392,308 | 2/1995 | Welch et al. | 372/92 |
| 5,430,748 | 7/1995 | MacCormack et al. | 372/29 |
| 5,438,585 | 8/1995 | Armour et al. | 372/45 |
| 5,485,481 | 1/1996 | Ventrudo et al. | 372/6 |
| 5,572,542 | 11/1996 | Dixon | 372/32 |

OTHER PUBLICATIONS

Epler et al., "Far–field Supermode Patterns of a Multiple–Stripe Quantum Well Heterostructure Laser Operated (~7330 Å, 300 K) In An External Grating Cavity", Appl. Phys. Lett. 45(4), Aug. 15, 1984, pp. 406–408.

Goldberg et al., "Injection Locking Characteristics of a 1 W Broad Stripe Laser Diode", Appl. Phys. Lett. 53(20), Nov. 14, 1988, pp. 1900–1902.

Goldberg et al., "Injection Locking of Coupled–Stripe Diode Laser Arrays", Appl. Phys. Lett. 46(3), Feb. 1, 1985, pp. 236–238.

Goldberg et al., "Broad–area High–Power Semiconductor Optical Amplifier", Appl., Phys. Lett. 58(13), Apr. 1, 1991, pp. 1357–1359.

Goldberg et al., "Injection Locking and Single–Mode Fiber Coupling of a 40 Element Laser Diode Array", Appl. Phys. Lett. 50(24), Jun. 15, 1987, pp. 1713–1715.

Goldberg et al., "Single Lobe Operation of a 40–Element Laser Array in an External Ring Laser Cavity", Appl. Phys. Lett. 51(12), Sep. 21, 1987, pp. 871–873.

Hohimer et al., "Injection–locking Characteristics of Gain–Guided Diode Laser Arrays with an "On–Chip" Master Laser", Appl. Phys. Lett. 56(16), Apr. 16, 1990, pp. 1521–1523.

Hohimer et al., "Single–Channel Injection Locking of a Diode–Laser Array with a CW Dye Laser", Appl. Phys. Lett. 47(12), Dec. 15, 1985, pp. 1244–1246.

Jansen et al., "Coherent Operation of Injection–Locked Monolithic Surface–Emitting Diode Laser Arrays", Appl. Phys. Lett. 54(26), Jun. 26, 1989, pp. 2634–2636.

Kapon et al., "Chirped Arrays of Diode Lasers for Supermode Control", Appl. Phys. Lett. 45(3), Aug. 1, 1984, pp. 200–202.

Lindsey et al., "Fundamental Lateral Mode Oscillation Via Gain Tailoring in Broad Area Semiconductor Lasers", Appl. Phys. Lett. 47(6), Sep. 15, 1985, pp. 560–562.

Major et al., "High Power, High Efficiency Antiguide Laser Arrays", Appl. Phys. Lett. 59(18), Oct. 28, 1991, pp. 2210–2212.

Matsumoto et al., "Single–Lobed Far–Field Pattern Operation in a Phased Array with an Integrated Phase Shifter", Appl. Phys. Lett. 50(22), Jun. 1, 1987, pp. 1541–1543.

Osinski et al., "Phased Array of High–Power, Coherent, Monolithic Flared Amplifier Master Oscillator Power Amplifiers", Appl. Phys. Lett. 66(5), Jan. 30, 1995, pp. 556–558.

Ramadas M.R. Pillai, "External Cavity Semiconductor Laser Arrays Insensitive to Paraxial Alignment", A Dissertation Presented to the Faculty of the Graduate School University of Southern California, May 1995, pp. 1–139 This thesis was not made available to the public in accordance with the requirements set forth in MPEP 2128.01 until some time after Mar. 25, 1996.

Ramadas Pillai et al., "External Cavity Semiconductor–Laser Array Insensitive to Paraxial Misalignment", Optics Letters, vol. 20, No. 20, Oct. 15, 1995, pp. 2108–2110.

Pillai et al., "Four–Pass Unstable External Cavity Semiconductor Laser Array Emitting Single Lobed Far–Field", Tuesday Poster, Tuesday Afternoon, Cleo '93, pp. 154–155.

Pillai et al., "Paraxial–Misalignment Insensitive External–Cavity Semiconductor–Laser Array Emitting Near–Diffraction Limited Single–Lobed Beam", IEEE Journal of Quantum Electronics, vol. 32. No. 6, Jun. 1996, pp. 996–1008.

Pillai et al., "Relative Intensity Noise of Laser–Diode Arrays", IEEE Transactions Photonics Technology Letters, vol. 3, No. 11, Nov., 1991, pp. 968–970.

Ramadas et al., "Analysis of Absorbing and Leaky Planar Waveguides: A Novel Method", Optics Letters, vol. 14, No. 7, Apr. 1, 1989, pp. 376–378.

Rediker et al., "Operation of Individual Diode Lasers as a Coherent Ensemble Controlled by a Spatial Filter Within An External Cavity", Appl. Phys. Lett. 46(2), Jan. 15, 1985, pp. 133–135.

Salzman et al., "Tilted–Mirror Semiconductor Lasers", Appl. Phys. Lett. 47(1), Jul. 1, 1985, pp. 9–11.

Salzman et al., "Phase–Locked Arrays of Unstable Resonator Semiconductor Lasers", Appl. Phys. Lett. 49(8), Aug. 25, 1986, pp. 440–442.

Seo et al., Compound Cavity Modes in Semiconductor Lasers with Asymmetric Optical Feedback, Appl. Phys. Lett. 54(11), Mar. 13, 1989, pp. 990–992.

Srinivasan et al., "High–Power Spatially Coherent Operation Of Unstable Resonator Semiconductor Lasers with Regrown Lens Trains", Appl. Phys. Lett. 61(11), Sep. 14, 1992, pp. 1272–1274.

Tilton et al., "High Power, Nearly Diffraction–Limited Output from a Semiconductor Laser with an Unstable Resonator", IEEE Journal of Quantum Electronics, vol. 27, No. 9, Sep. 1991, pp. 2098–2108.

Waarts et al., 900mW, cw Nearly Diffraction–Limited Output from a GaAlAs Semiconductor Laser Array in an External Talbot Cavity, Cleo '91, pp. 242–243.

Wang et al., "Tunable Multiterahertz Beat Signal Generation From A Two–Wavelength Laser–Diode Array", Optics Letters, vol. 20, No. 11, Jun. 1, 1995, pp. 1292–1294.

Welch et al., "High Power cw Operation of Phased Array Diode Lasers with Diffraction Limited Output Beam", Appl. Phys. Lett. 47(11), Dec. 1, 1985, pp. 1134–1136.

Wittmann et al., "Narrow–Linewidth Laser With A Prism Grating/Grin Rod Lens Combination Serving As External Cavity", Electronics Letters, vol. 23, No. 10, May 7, 1987, pp. 524–526.

Yaeli et al., "Array Mode Selection Utilizing An External Cavity Configuration", Appl. Phys. Lett. 47(2), Jul. 15, 1985, pp. 89–91.

Zorabedian et al., Alignment–Stabilized Grating–Tuned External–Cavity Semiconductor Laser, Optics Letters, vol. 15, No. 9, May 1, 1990, pp. 483–485.

EXTERNAL CAVITY MICRO LASER APPARATUS

FIELD OF THE INVENTION

This invention relates to external cavity micro laser apparatus wherein one or more multimode micro lasers (as herein defined) are efficiently coupled directly into the input aperture of an optical fiber or other optical waveguide.

BACKGROUND OF THE INVENTION

As used herein, the term "external cavity micro laser apparatus" means apparatus comprising multi-mode micro laser means (as herein defined) having an external cavity for accomplishing mode selection, mode mixing, frequency selection, pulse shaping, beam take-off, and the like.

As used herein, the term "multi-mode micro laser" (or "multi-mode micro laser means") is intended to mean lasing devices, typically but not necessarily of semiconductor construction, which are micro-miniature in size with dimensions typically measured in microns, which may produce one-dimensional or two-dimensional coherent, partially coherent or incoherent emissions, and which produce multiple modes each with multiple lasing lobe components. The term is intended to embrace what are today commonly known as "broad area lasers" or "BALs" which may have an aspect ratio of, e.g., 50:1 to 400:1 (slow axis to fast axis ratio). The term encompasses "laser arrays" which comprise a series of spaced coupled or uncoupled emitters—either broad area lasers or standard lasers. The term also includes laser bars which may be up to a few centimeters wide, e.g., which may contain an array of uncoupled BALs, or a two-dimensional stack of such laser bars. Typical broad area lasers have a single broad stripe for increased output power. Laser arrays have individual current stripes, one for each emitter, which may be closely spaced such that there is a strong mutual coupling or interaction between the light generated by the emitters. In practice, a laser array behaves similar to a broad area laser with respect to its modal properties, except that a laser array prefers to oscillate in higher order modes of order N, where N is equal to the number of stripes or emitters. In a working system "N", for example, might have a value of 10.

An intense need exists for diffraction limited laser sources of several hundred milliwatts of output power for pumping optical fiber amplifiers in communication networks. Commercially available semiconductor lasers are capable of delivering high power, however, the need for an efficient and inexpensive means for coupling the semiconductor laser energy over a few hundred milliwatts into the input aperture of an optical fiber or other optical waveguide has not, prior to this invention, been satisfied.

There are two characteristics of output beams from micro lasers that make single mode fiber coupling inefficient. First, in the slow axis direction (major axis direction of the near field elliptic output beam), micro lasers support multiple transverse modes that are incoherent with respect to each other. Consequently, the output beam cannot be focused with near-diffraction-limited performance in this direction.

Second, the high ellipticity or high aspect ratio of the output beam cross section (typically greater than 1:100 at the near field) results in poor mode matching with the typically circularly symmetric modes of optical fibers.

SUMMARY OF THE INVENTION

In accordance with the present invention, the coherence of the output beam from such micro lasers is dramatically improved to make possible near-diffraction-limited imaging of the output beam into the input aperture of an optical fiber or other optical waveguide. In accordance with an aspect of the invention, means are provided for reshaping the aspect ratio of the output beam such that it conforms more closely to the aspect ratio of the input aperture of the coupled optical waveguide. In accordance with an aspect of the invention, the input aperture is employed as a spatial filter to select desired lasing lobe components of the output beam.

In order to obtain near-diffraction-limited performance in the slow axis direction, either the fundamental mode or a group of phase-locked higher order modes of the micro laser are excited by appropriate optical feedback. To achieve an approximately circularly symmetric spot size that matches the input aperture of the coupled optical waveguide, an appropriately designed coupling optics having an anamorphic component is employed.

BRIEF DESCRIPTION OF THE FIGURES

FIGS. 1, 3 and 4A are in-plane views—that is views in the plane of the slow axis. FIG. 2 is a view in the plane of the fast axis. FIG. 4 is a perspective view.

DESCRIPTION OF THE PREFERRED EMBODIMENTS

Figure 1:
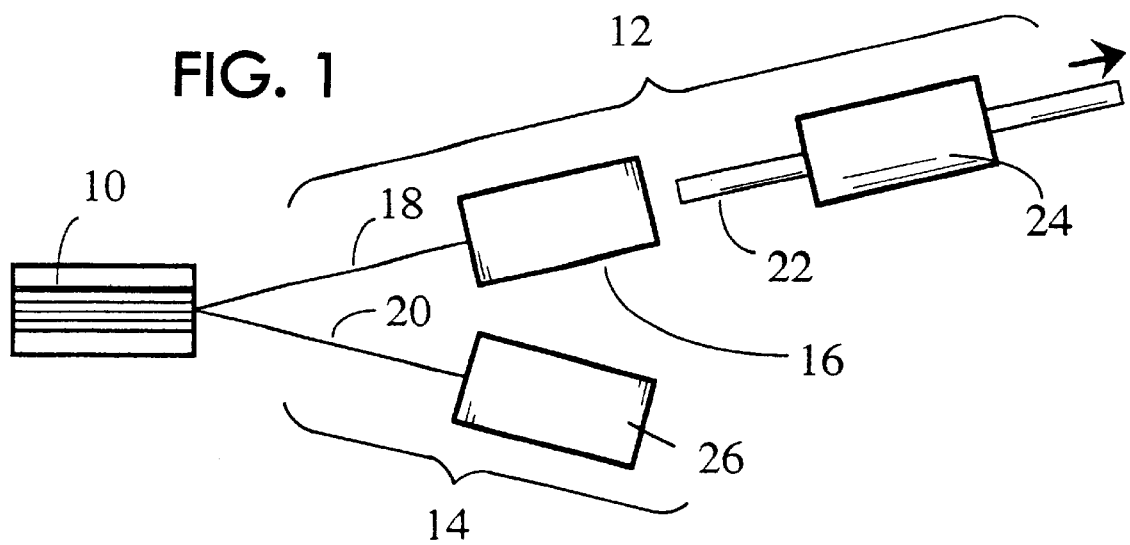
FIGS. 1–4 and 4A illustrate a preferred embodiment of the invention.

FIG. 1 is a highly schematic representation of external cavity micro laser apparatus according to the present invention which may include a micro laser 10. The micro laser 10 has an emission aperture (not shown in FIG. 1) with a relatively long dimension lying in a slow axis plane and a relatively short dimension lying in a fast axis plane, the laser 10 producing multiple transverse lasing modes, the multiple modes having multiple lasing lobe components.

The apparatus of FIG. 1 includes an external cavity embracing the micro laser 10. The external cavity has an output section 12 and a feedback or return section 14.

As will be described, the output section 12 includes a spatial filter for selecting at least one of the transverse lasing lobe components emitted by the laser 10 and imaging means or coupling optics 16 for imaging at the spatial filter a far-field spatial frequency distribution of the emission aperture at which the lasing lobe components are spatially distinguishable.

The output section 12 include an optical waveguide, here shown as an optical fiber 22, functioning as the aforesaid spatial filter, as will be described in detail hereinafter. The output section 12 also includes an output coupler 24 which includes feedback means for causing a fraction of the optical energy in the selected lasing lobe components to be fed back to the laser means for amplification.

The return section 14 includes efficient return means 26 for returning at least a major portion of (ideally all of) the amplified and reflected lasing lobe component to the laser means. Lines 18, 20 represent the symmetry axes of the lobes excited by the external cavity laser apparatus. In general, the dominant mode component of both lobes belong to the same higher order laser mode.

As will be described in much more detail hereinafter, the imaging means or coupling optics 16 includes an anamorphic component which shapes the output lasing lobe component to be nearly circularly symmetric and nearly astigmatism free. The coupling optics 16 forms a waist of size close to the mode size of the fiber 22 for high fiber coupling efficiency. The location of the waist is at the in-plane focal plane for maximum mode discrimination, as will be explained. Also, this plane coincides with the out-of-plane image plane of the coupling optics 16.

Figure 2:
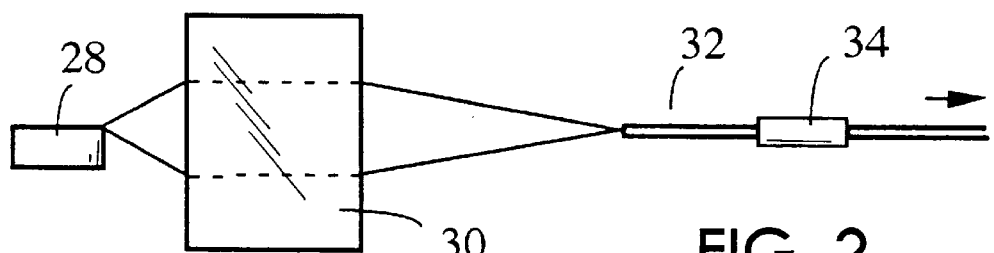
Figure 3:
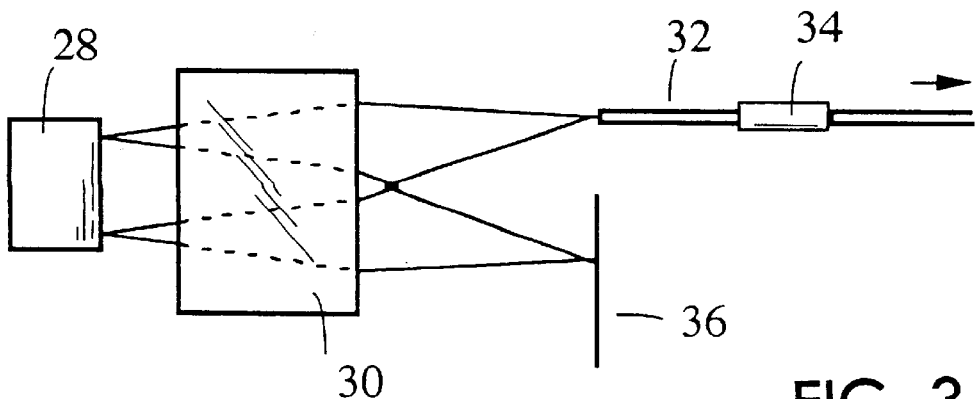

FIG. 2 is a view in the fast axis plane, and FIG. 3 is a view in the slow axis plane, of the apparatus illustrated in FIG. 1, when the same coupling optics are shared by the output section and the return section.

In FIGS. 2–3, the micro laser is designated 28. The coupling optics is designated 30. The optical fiber is shown at 32 and the output coupler at 34. FIG. 3 illustrates a high reflectivity mirror 36 for returning to the laser 28 ideally all of the selected amplified and reflected lasing lobe component back to the laser 28.

The array-to-array feedback optics in the return section 14 efficiently feeds back the reflected lasing lobe component into the micro laser. The feedback optics images the laser emission aperture back upon itself with unity magnification and without significant loss of power. The selected lasing lobe component (coming in from the fiber) is coupled into the laser, gets amplified and forms a bright spot on to the mirror 36. The mirror 36 is placed in the same plane as tip of the fiber 32. The position of this spot and the fiber tip lie symmetrically opposite about the laser optical axis and in a plane perpendicular to the laser axis. This bright spot is reflected back by mirror 36, gets coupled and amplified in the laser 28 much more strongly and forms a powerful output beam. The output beam couples into the fiber 32 with high efficiency. The FIGS. 1–4 arrangement is somewhat insensitive to small in-plane misalignments of the fiber, however, there should be an optimum position for the maximum output for a given drive current.

When coupling optics in both the return section and the output section are not shared, the location and shape of the mirror 36 is such that the reflector's curvature matches the curvature of the impinging optical wavefront. The feedback optics may be as simple as a spherical mirror that combines the necessary imaging elements, and the highly reflective mirror 36. As will be described, to reduce the total number of components in the apparatus, the feedback optics may share optics with the output section 12.

The resonant external optical cavity is formed by the mirror 36 in the return section 14 and partially reflective means (to be described) in the output coupler 34 (24 in FIG. 1).

Figure 4:
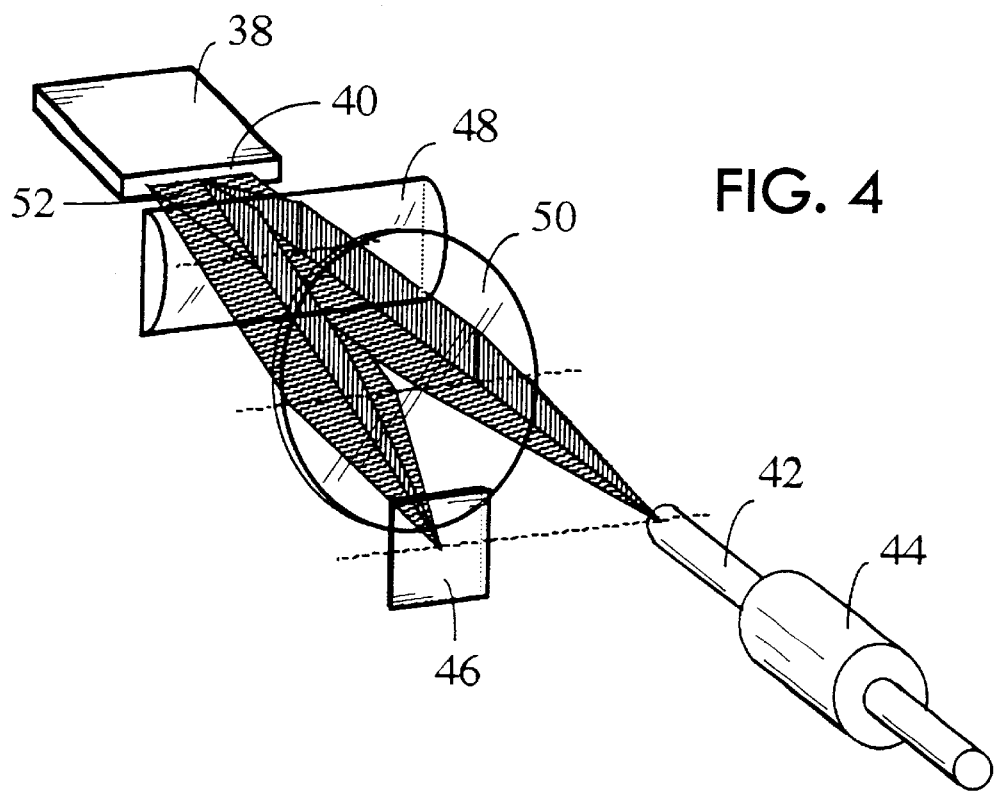

FIG. 4 is a perspective view of the apparatus illustrated more schematically in FIGS. 1–3. FIG. 4 illustrates a micro laser 38 having an emission aperture from which laser energy is emitted. In FIG. 4 an optical waveguide is shown at 42 and an output coupler is shown at 44. FIG. 4 illustrates a mirror 46 in the return section. The coupling optics in the FIG. 4 geometry comprises anamorphic lens means, here shown as a cylinder lens 48, and non-anamorphic lens means 50 (which may be a spherical, aspheric, ball, or graded index lens). The anamorphic lens 48 collimates the beam 52 in the out-of-plane direction. FIG. 4 illustrates, like FIGS. 1–3, a higher order (non-fundamental) mode operation.

The focal length of the anamorphic lens 48 is such that the out-of-plane beam spread is roughly equal to the in-plane beam width (the width of the micro laser active region or emission aperture 40). The focal length of the non-anamorphic lens 50 is such that it forms a waist of a size that is substantially equal to the spot size of the input aperture of the waveguide 42.

In the fast axis direction (the vertical direction in FIG. 2), the near-field beam full-width at half maximum (FWHM) is about one micron and the beam divergence is typically about 35 to 40 degrees FWHM as the beam leaves the laser emission aperture. Also, in this direction, the laser supports only a single transverse mode and consequently the beam has high spatial coherence. Therefore, in this direction, the beam can be focused to a diffraction limited spot of size substantially equal to the coupled fiber spot size by using well corrected coupling optics. Commercially available micro lasers come with 95% back facet reflectivity and 5% front facet reflectivity. They are distributed by number of manufacturers including Spectra Diode Labs (San Jose, Calif.) and Semiconductor Laser International Corporation (Endicott, N.Y.).

The present invention may be employed with a laser whose front facet reflectivity is of the order of few tenths of a percent. Antireflection coatings to yield such low reflectivity can be custom made by the manufacturers. For sufficiently small distances, the laser output beam in the slow axis plane can be considered collimated (because of the low divergence angle of 0.5% degree, e.g.), but divergent (35–40 degrees, e.g.) in the fast axis plane. Appropriate anamorphic coupling optics that has different focal lengths in the fast-axis and slow axis directions may be chosen to obtain a circular spot that is equal to the spot size of the fundamental mode of the fiber (typically 6 microns for commercially available Corning flexcore single mode fiber, or typically the core diameter for a multimode fiber).

An important advantage of the FIGS. 1–4 configuration is that it provides a non-beam-steering waveguide coupled output. Beam steering (as drive current changes) in a free running micro laser is dependent upon changes in refractive index of the laser active medium due to: 1) drive current variations and 2) drive-current-induced temperature changes (thermal lensing). Since the angle of refraction depends upon the refractive index, the beam steers with the index changes (for an incident beam at a constant angle of incidence).

Beam steering effects are difficult to eliminate completely from most injection locking and external cavity schemes.

For some of the known external cavity schemes, beam steering manifests as a reduction of output power below the expected value. In FIG. 3, beam steering simply changes the position of the spot on the external mirror (36 in FIG. 3) in the in-plane direction. Since this spot is a real image of the fiber tip, according to the reciprocity theorem a real image of this spot is formed back on the fiber tip and is coupled into the fiber. Thus the FIGS. 1–4 embodiment is compensated for any thermal lensing or drive-current-induced index changes that may be present.

FIGS. 1–4 illustrate the feedback or return optics in the return section schematically. In commercial practice, the return mirror (46 in FIG. 4, for example) is, due to the small angle subtended by the output and return beams (represented by lines 18, 20 in FIG. 1) will be closely adjacent to the input aperture to the optical waveguide.

As discussed above, in accordance with an important aspect of the present invention, an optical waveguide, shown in FIGS. 1–4 as an optical fiber, functions as a spatial filter.

In the microlaser apparatus according to present invention, imaging means are provided for imaging at the input aperture of an optical waveguide a far field spatial frequency distribution of the emission aperture of the microlaser at which lasing lobe components are spatially distinguishable. As will be described, the input aperture of the optical wave guide is sized an positioned to select one or more predetermine lasing lobe components.

Figure 4A:
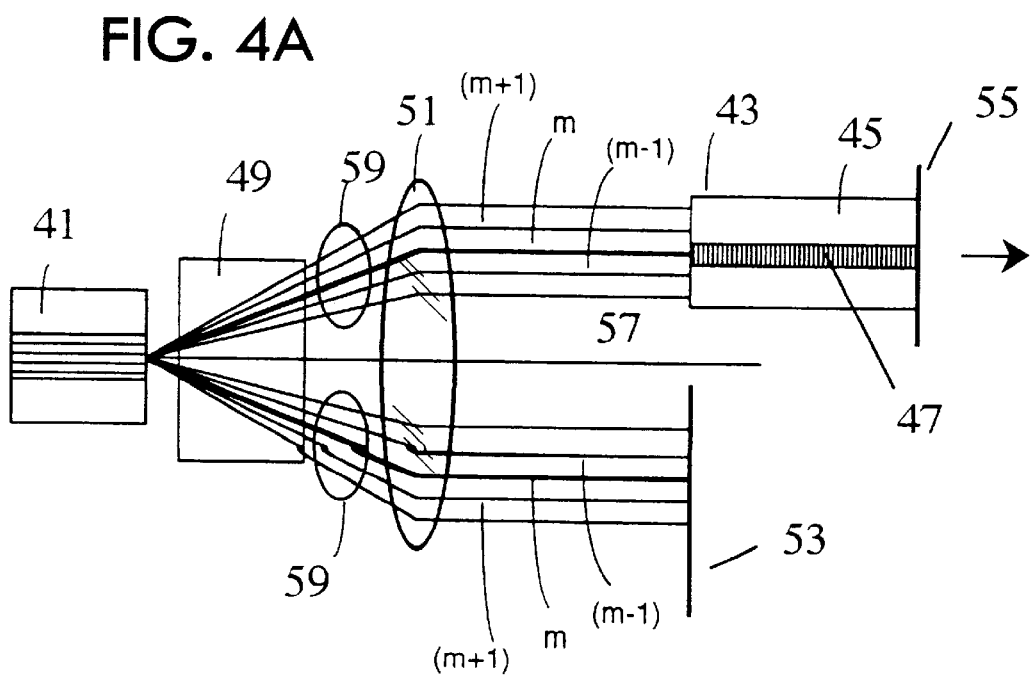

FIG. 4A is a view which depicts the manner in which spatial filtering of selecting laser lobe component(s) is achieved in accordance with the present invention. FIG. 4A illustrates a geometry similar to that shown in FIGS. 1–4, comprising a micro laser 41, an optical waveguide 43 having a cladding 45 and a core 47, and imaging means shown in the form of an anamorphic lens 49 and a non-anamorphic lens 51. A high reflectivity return mirror is shown at 53. Partially reflective means 55 returns a predetermined fraction of the output beam back to the micro laser 41, as described herein.

It is noted that each broad-area mode may be closely approximated to have a sinusoidal mode shape in the near field. One can visualize that each of these modes is constructed by an interference of an up-propagating (in FIG. 4A) plane wave and down-propagating plane wave making an appropriate small but equal angle with laser axis 57. (Interference of two plane waves gives a sinusoidal profile). Up-propagating wave forms an upper lobe and down-propagating wave forms a lower lobe in the far field. Thus, each mode forms a double-lobed pattern in the far field (except the fundamental mode which forms a slightly broader single-lobed pattern). In FIG. 4A, lobes of mth mode and their adjacent mode lobes (m+1, m−1) are shown.

Lines 59 represent symmetry axes of broad-area mode lobes. Even though the lobes appear spatially isolated in the figure, there is considerable overlap between adjacent lobes and the overlap is a minimum at the Fourier plane (in-plane focal plane where the waveguide input aperture is placed). FIG. 4A shows selection of the mth mode lobe by the waveguide aperture. The (m+1)th mode lobe and (m−1)th lobes experience a much higher loss compared to the mth mode lobe. Note that when mth mode lobe is lasing, the laser supports a nearly coherent superposition of a group of modes around the mth order mode.

Figure 5:
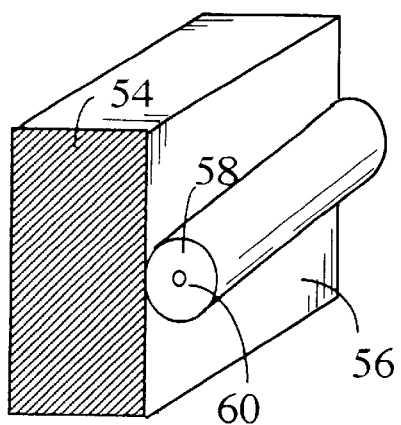
FIG. 5 is a highly schematic view of optical waveguide input apparatus according to the present invention.

FIG. 5 schematically illustrates fiber input apparatus comprising a highly reflective return mirror 54 located laterally spaced from but contiguous to an optical waveguide 56. The waveguide 56 has a cladding 58 and a core with an input aperture 60.

Figure 6:
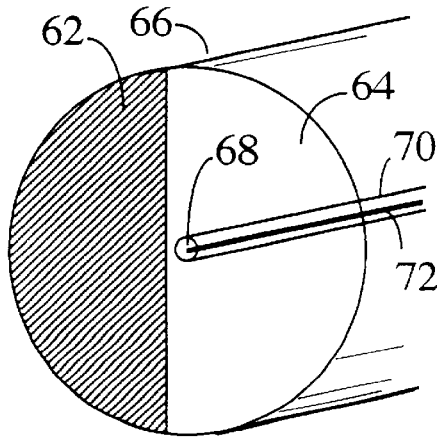
FIG. 6 shows alternative optical waveguide input apparatus.

FIG. 6 illustrates another embodiment of fiber input apparatus comprising a ferrule 66 which supports an optical fiber 70 having a core 72 with an input aperture 68. A portion 62 of an end surface 64 of the ferrule 66 is mirrorized or otherwise made reflective to constitute the return mirror (46 in FIG. 4, for example).

In the FIG. 6 arrangement, the ferrule 66 may, for example, be 0.1 inch in diameter and may be composed of a ceramic material. The portion 62 may have a multilayer dielectric coating to create a highly reflective mirror surface.

The fiber 70, which may for example be 125 micro meters in diameter, is located on a facet of the ferrule 66 end surface 64 which is angle polished or anti-reflection coated to suppress reflections off the ferrule and fiber end surfaces back into the micro laser.

Figure 7:
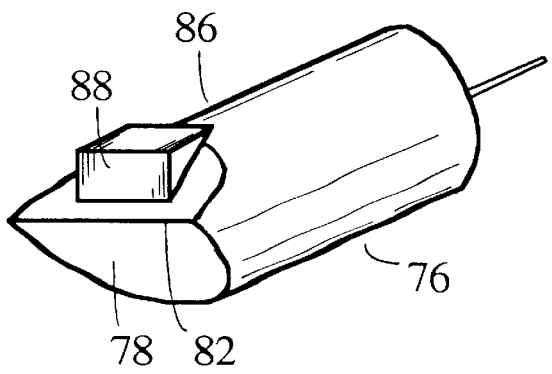
FIGS. 7–8 are perspective and side elevation views of yet another embodiment of waveguide input apparatus according to the invention.
Figure 8:
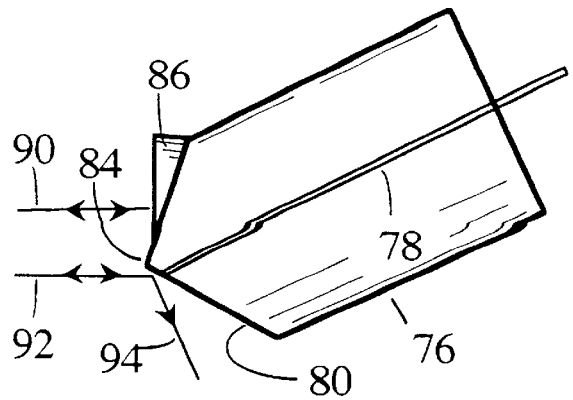

FIGS. 7–8 illustrate yet another return mirror arrangement. In FIGS. 7–8 a ferrule 76 has a dual facet chisel-shaped termination, with a fiber 78 being located in one facet 80 slightly offset from an edge 82 formed at the convergence of facet 80 and the adjacent facet 84. The facet 80 and the face of the embedded fiber 78 are preferably formed at the Brewster angle for a maximized transmission into the optical fiber 78 and minimized reflection losses.

On the opposed facet 84 of the ferrule is positioned a wedge 86. The wedge 86 has a reflective surface 88 which constitutes the return mirror (46 in FIG. 4 for example). As discussed above, preferably the plane of the reflective surface 88 includes the input aperture of the core of the optical fiber 78. In order to achieve such coplanarity of the reflective surface 88 and the input aperture of the core of the fiber 78, the wedge 86 may be adjusted in position along the sloping facet 84 and secured thereon when coplanarity is achieved.

In FIG. 8, line 90 represents the optical beam in the return section being reflected back to the laser. Line 92 represents the optical beam in the output section which enters the fiber 78 to provide a useful output from the system. Energy reflected off the face of the fiber 78 and ferrule 76 is represented by line 94. This energy may be employed as a monitoring beam to monitor the location and other parameters of the output beam.

The input aperture of the output optical fiber receives an output laser beam from the micro laser. The emission aperture of the micro laser means has a near field distribution with a high aspect ratio, whereas the input aperture of the optical waveguide is more circularly symmetric. The imaging means in accordance with the present invention, as noted, has an anamorphic component for reshaping the elliptic beam distribution to better conform to the typically circular input aperture of the optical fiber core.

Whereas any of a number of geometries may be employed, as will be described below, certain general principles of the coupling optics employed in the practice of the present invention will now be described.

Figure 9:
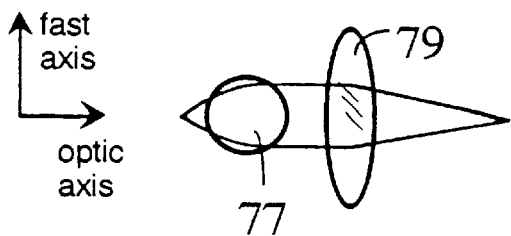
FIGS. 9–12 illustrate various anamorphic coupling optics which may be employed in the practice of the present invention.
Figure 10:
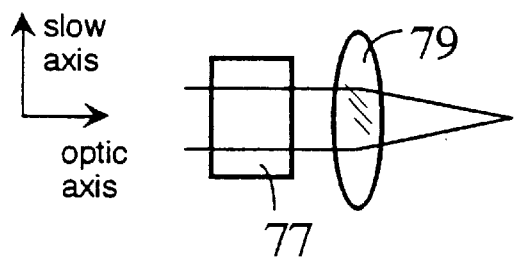
Figure 11:
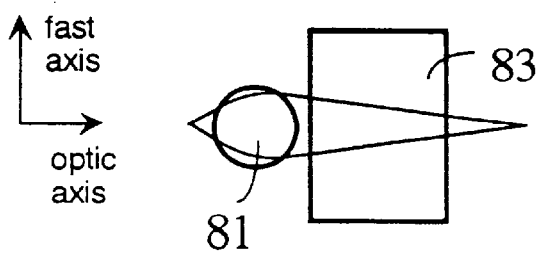
Figure 12:
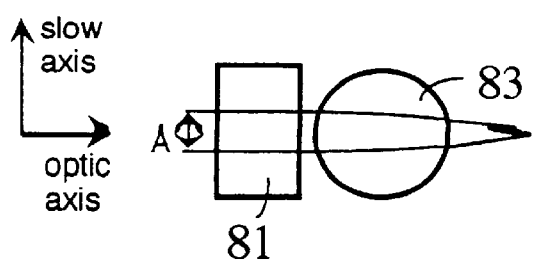

FIGS. 9 and 10 illustrate coupling optics as comprising an anamorphic lens 77 and a spherical lens 79. In FIGS. 11–12, two anamorphic lenses 81, 83 of different power are employed. The anamorphic lens 77 may, e.g., be graded index cylinders or aspheric rods to minimize spherical aberration. The anamorphic lenses 77, 81 should have a high numerical aperture above 0.5. All lens surfaces should ideally be anti-reflection coated. The spherical lens 79 may alternatively be an aspheric lens, ball lens, gradient index lens, or any other combination of diffractive and refractive optical elements. The out-of-plane object plane and image plane of the lens combination coincides with in-plane focal planes of the combination. The focal lengths of the lenses are chosen such that a nearly circular spot whose size matches with the modal spot size of the fiber, is formed at one of the in-plane focal planes. The in-plane spot size of the output beam at the fiber input face may be optimized to account for the near-diffraction-limited performance in this plane.

In the FIGS. 9–10 combination (anamorphic and spherical), the anamorphic lens 77 first collimates the beam in the fast axis direction to a beam size comparable to the array aperture. The lens 79 focal length is chosen such that the focused spot has the same size as the waveguide spot size. All the lens surfaces are antireflection coated to 0.1% reflectivity. Anamorphic lenses are available from Doris Lens, Inc., Quebec, Canada, for example. Spherical lens 79 is available from many vendors. In the second combination, two anamorphic lenses can be used, one for each axis (fast axis and slow axis) so that a circular spot is formed at the fiber face. The advantage of the FIGS. 11–12 geometry is that the size of the spot can be controlled independently in both axis by adjusting the axial positions of the lenses 81, 83 relative to the array. However, the disadvantage is that the lens 83 can introduce additional spherical aberration in the out-of-plane direction. The FIGS. 9–10 combination does not introduce aberrations because well-corrected spherical lenses are readily available.

FIGS. 13–16 illustrate alternative embodiments of the invention involving different arrangements of the optics in the output section and the return section to achieve the afore-described objectives of the invention.

Figure 13:
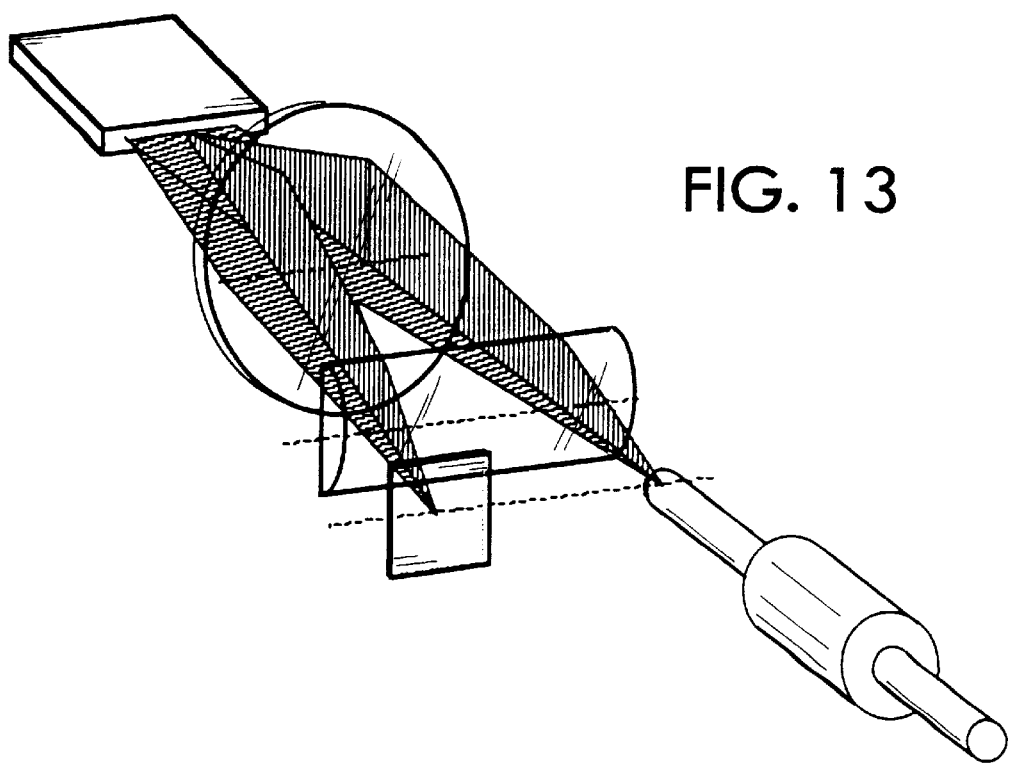
FIGS. 13–16 illustrate alternative embodiments of an execution of the invention utilizing transverse micro laser modes.

Specifically, the FIG. 13 embodiment is similar to the FIG. 4 embodiment described above, with the exception that the relative positions of the anamorphic lens means and the non-anamorphic lens means is interchanged.

Figure 14:
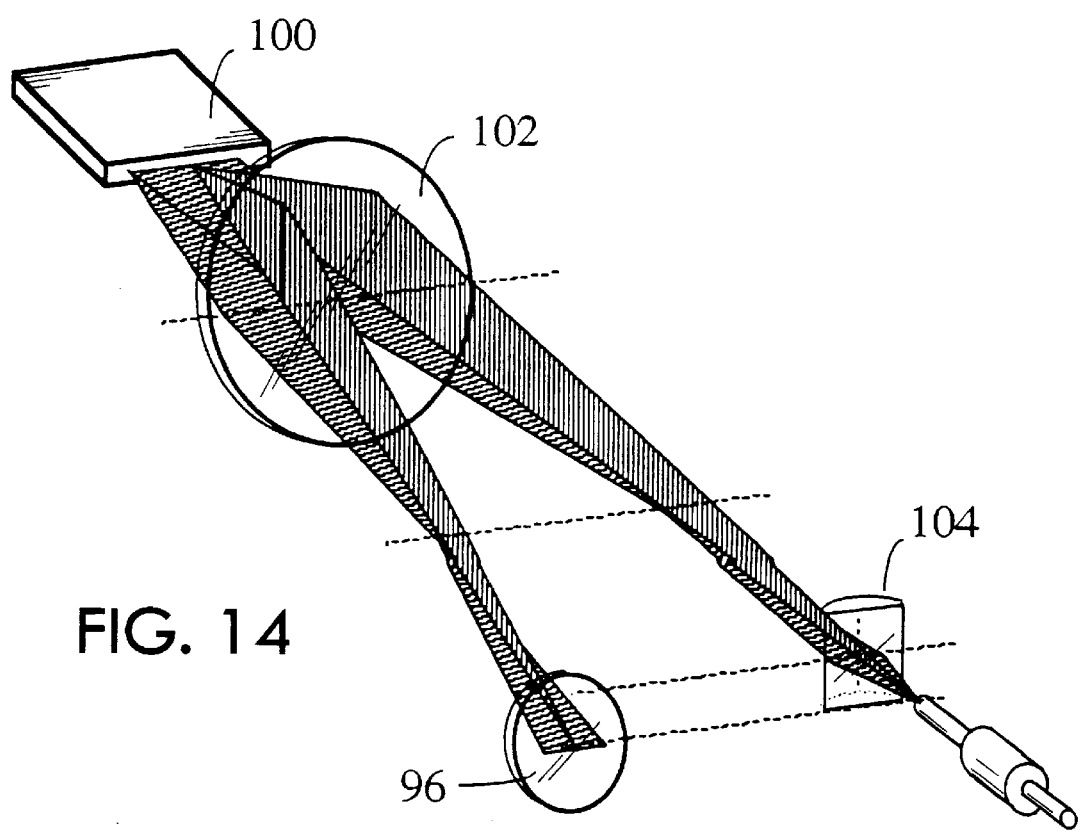

FIG. 14 is related to the FIG. 13 embodiment, however, in the FIG. 14 arrangement the return mirror 96 may be a spherical mirror having a curvature equal to its distance from the focal plane of a non-anamorphic lens 102. The anamorphic lens component in the system is a cylinder lens 104 in the output section whose position and focal length is chosen such that an astigmatically corrected circular beam with waist size equal to the fiber spot size is formed at the image plane of the non-anamorphic lens 102.

Figure 15:
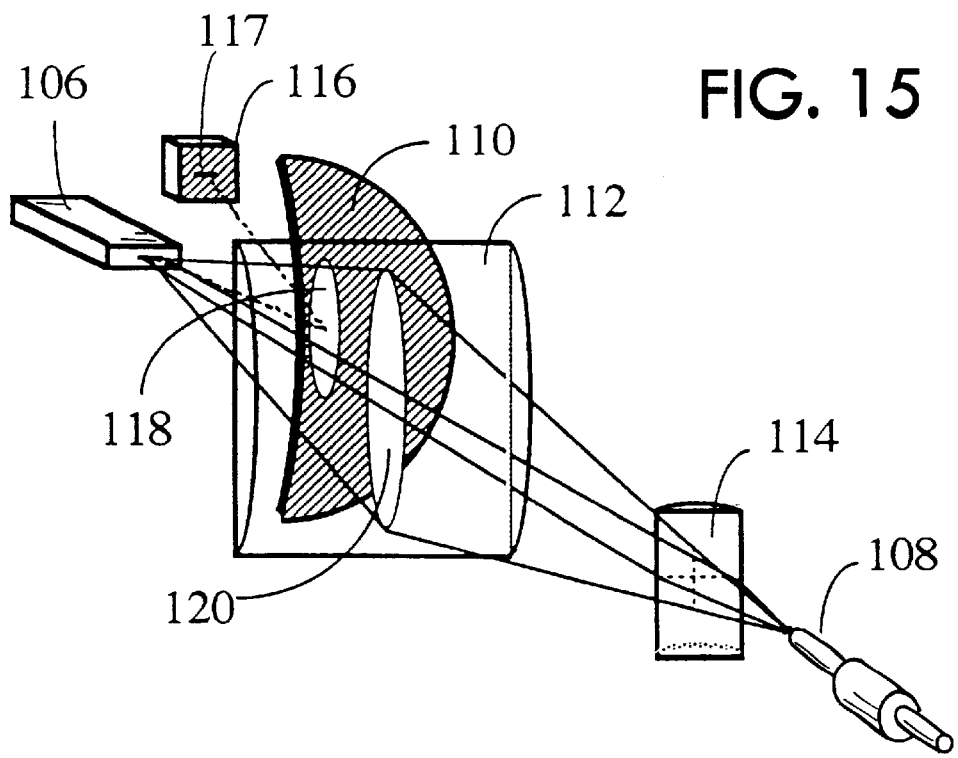

FIG. 15 illustrates external cavity micro laser apparatus according to the invention comprising micro laser 106, optical fiber 108, and coupling optics in the form of a truncated imaging mirror 110. An anamorphic lens 112 encompasses only the output section, and a second anamorphic lens 114 at 90 degrees relative to lens 112 influences the output beam in the in-plane direction.

Thus the array-to-fiber coupling optics consist of two crossed anamorphic lenses 112, 114. The focal lengths and positions of the anamorphic lenses 112, 114 are chosen such that the beam is corrected for astigmatism and forms a nearly circular waist of size substantially equal to the fiber spot size.

An auxiliary plane mirror 116 functions as the cavity boundary in the return section. A real image of the emission aperture 117 of the micro laser 106 is formed on the plane mirror 116 by the imaging mirror 110 in order to increase the tolerance for component alignment. Alternatively, the plane mirror 116 may be eliminated and the imaging mirror 110 may be reoriented to form a real image of the emission aperture 117 of the micro laser 106 upon itself.

Figure 16:
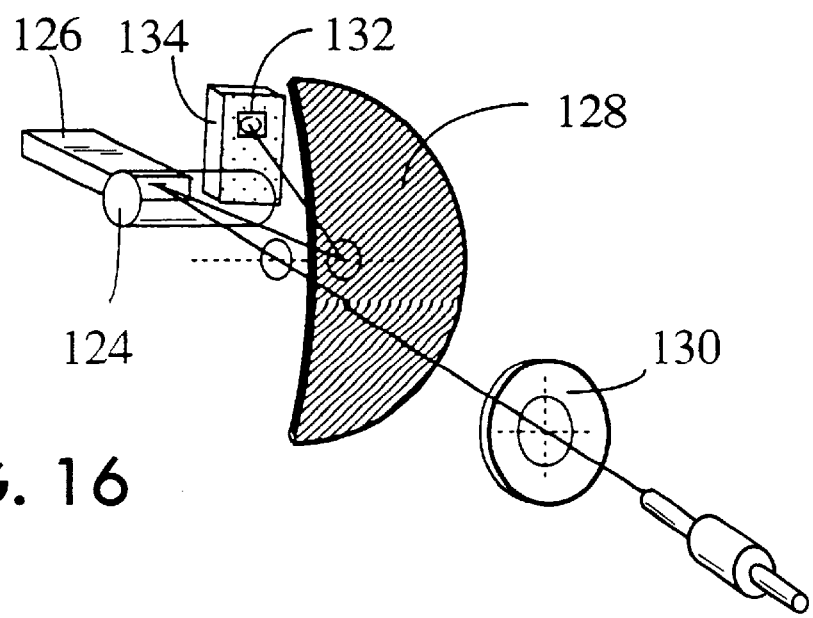

In FIG. 15, the elongated shape of the lasing lobe as it impinges on the imaging mirror 110 is shown at 118. The shape of the lasing lobe at the anamorphic lens 112 is shown at 120. FIG. 16 schematically illustrates yet another embodiment of the invention wherein an anamorphic lens 124 is disposed adjacent a micro laser 126 such as to correct the astigmatism in the output beam from the laser as the beam reaches an imaging mirror 128. As the output beam is astigmatism-corrected, a spherical lens 130 may be employed in lieu of the anamorphic lens 114 utilized in the FIG. 15 arrangement.

The FIG. 16 arrangement includes optional pulse shaping means, here shown as a saturable absorber 132 located adjacent the plane of a plane mirror 134 in the return section corresponding to the plane mirror 116 in the FIG. 15 arrangement. It should be understood that pulse shaping means such as a saturable absorber may be employed in any and all of the embodiments illustrated herein in applications wherein beam pulse shaping is desired.

Figure 17:
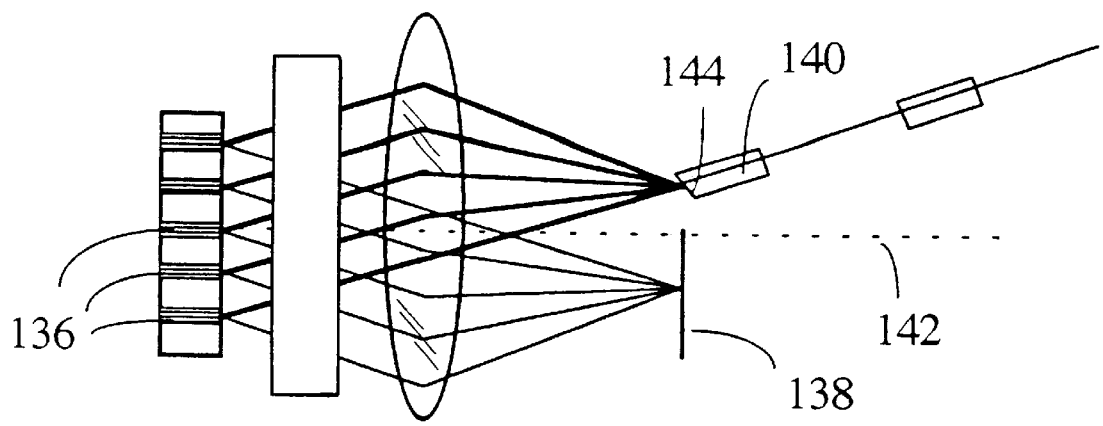
FIGS. 17–19 illustrate embodiments of the invention employing micro lasers having one-dimensional and two-dimensional arrays of emitters.

FIG. 17 schematically depicts an embodiment of the invention similar to FIG. 4, but illustrating that the invention may be used with an array of uncoupled emitters 136. Off-axis power extraction is shown. For on-axis power extraction, as will be described in connection with FIGS. 20–21, the return mirror 138 is removed and the angle-polished (or anti-reflection-coated) fiber 140 is brought to the array axis 142. The distance of the fiber face 144 from the axis determines the dominant mode component of each of the laser. If the fiber selects the fifteenth mode of the first emitter, for example, the same fifteenth order mode is selected for all other lasers.

Figure 18:
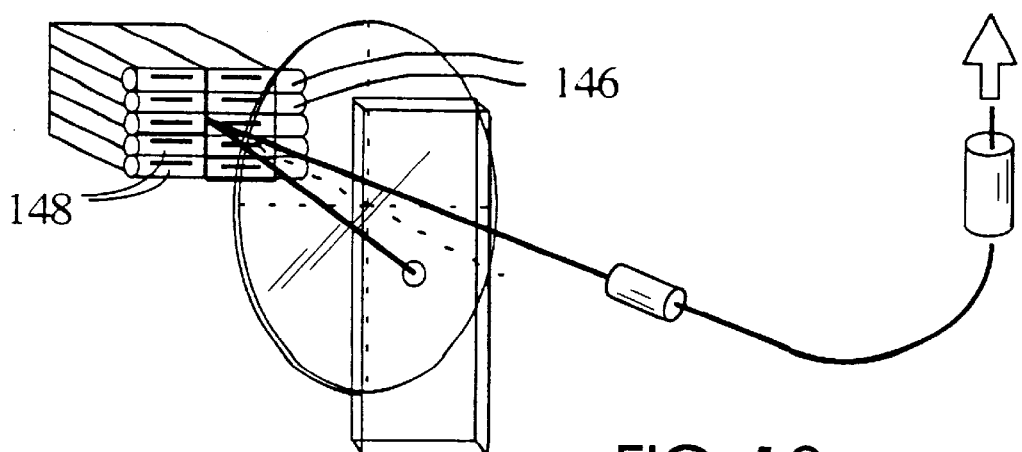

FIG. 18 illustrates yet another embodiment of the invention which is related to the FIG. 17 embodiment but differs in two respects. The micro laser is shown as having a two dimensional stack of emitters 148. It should be understood from the definition of "multimode micro laser" or "multimode micro laser means" set forth above that those terms encompass not only single emitters, but linear arrays of uncoupled emitters as well as two dimensional arrays or stacks of coupled and uncoupled emitters. In the FIG. 18 embodiment, as opposed to the FIG. 17 embodiment, for example, the anamorphic lens which serves the entire array of micro emitters 136 is eliminated and individual anamorphic lenslets 146, one associated with each emitter 148, collimates the output of the emitter in the fast axis plane (out-of-plane direction). This produces a nearly uniform parallel beam of light in the vertical direction (fast-axis plane. Thus the effect of the discontinuity of the emitters in the vertical direction is reduced. Further, the compactness of the overall system is improved.

Figure 19:
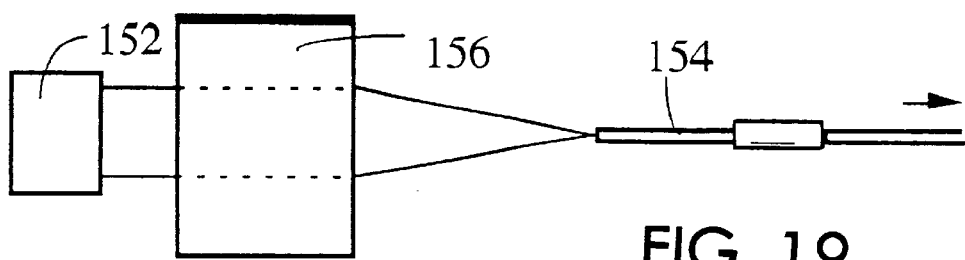
Figure 20:
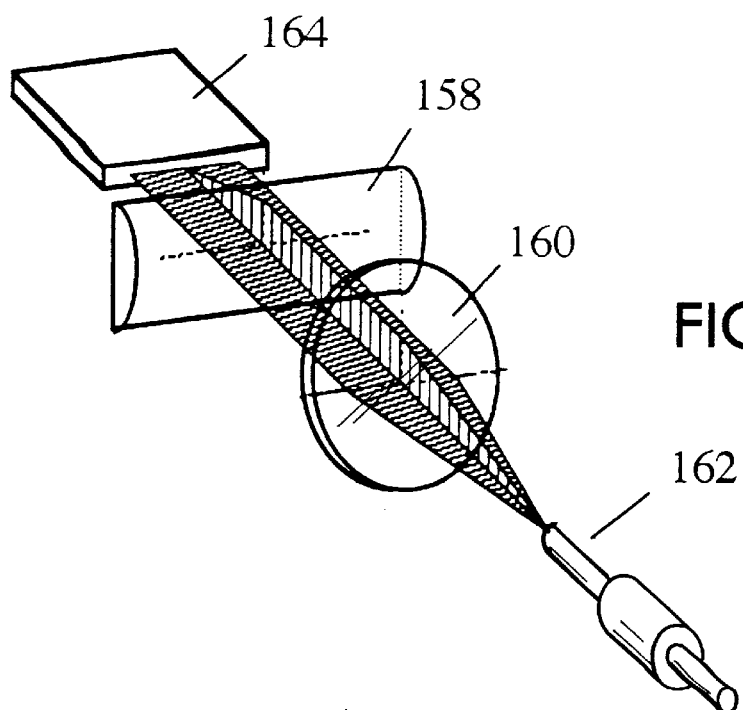
FIGS. 20–21 are fast plane (FIG. 20) and perspective (FIG. 21) views of an on-axis execution of the present invention wherein the fundamental mode of the micro laser is utilized.

FIG. 19 is an in-plane view of an embodiment for extracting output power from the fundamental mode of a multimode micro laser means. (Please revert to FIG. 2 for an out-of-plane view which is the same for both transverse mode and fundamental mode executions.) In FIG. 19 a multimode micro laser is indicated at 152; an optical fiber is shown at 154. Coupling optics are shown at 156. In FIGS. 19 and 20 the solid lines represent beam profiles (locus of half-maxima points of the beam). Dashed lines represent a possible beam profile within the coupling optics which can be parallel or non parallel depending on the elements in the coupling optics.

The coupling optics should be designed such that a circular spot of size that matches with the spot size of the modes of the fiber is formed at the in-plane focal plane of the coupling optics for the best laser mode discrimination. The fiber input aperture is placed at the in-plane focal plane which coincides with the out-of-plane image plane. The laser emission aperture is placed at the other in-plane focal plane which coincides with out-of-plane object plane.

FIG. 19 shows the in-plane view (plane normal to the fast axis) wherein the beam width is equal to the width of the current stripe or aperture size. Typically, micro lasers with aperture size from 50 microns to 1 cm are available commercially. For an array with 100 micron stripe width, the diffraction limit corresponds to about 0.5 degree. However, because of the multimode oscillation a divergence of about 10 degrees (20 times the diffraction limit) is typical. With an appropriate feedback from the output fiber, this divergence can be reduced to a near-diffraction limit (less than twice the diffraction limit) and focused to a spot size that is substantially equal to the fiber spot size. This configuration excites the fundamental mode of the array and hence it may be called "on-axis excitation". This is the simplest scheme. However, off-axis excitation has significant advantages in terms of far-field lobe broadening. When a micro laser is used to amplify a beam of light, the gain of the array induces a broadening of its far field lobe. The greatest broadening is for the on-axis beam, which means that an on-axis beam diverges the greatest. For an off-axis beam the gain-induced broadening is less. The dominant mode component for the on-axis beam is the fundamental mode. Due to gain-broadening, the FWHM of the fundamental mode lobe has the largest value (3–4 times the diffraction limit) and it approaches the diffraction limit at higher order mode lobes. Even though for diffraction-limited performance the array should be operated off-axis, there is a disadvantage. The radiation loss of the laser modes increases with mode number, thereby reducing the effective amplification of the off-axis beam. Due to these competing effects, there is an optimum angle for amplification, which has been shown to exist experimentally. Therefore, in many situations, off-axis excitation scheme may extract a higher output power than the on-axis scheme. When multimode fibers are used, diffraction-limited-performance is not critical, and consequently on-axis schemes may prove to be simpler.

FIG. 20 is a perspective view similar to FIG. 19, but showing more specifically the coupling optics as comprising an anamorphic lens 158, followed by a non-anamorphic lens 160. The FIG. 20 arrangement excites predominantly the fundamental mode of micro laser 164. The spatial filtering output waveguide, here shown as a fiber 162, is placed at the in-plane focal plane of the anamorphic coupling optics. A nearly circular waist (spot) that matches the fiber spot size is formed at this plane so that the output laser light from the micro laser 164 is efficiently coupled into the fiber 162.

The spatial filtering output fiber 162 is placed at the in-plane focal plane of the anamorphic coupling optics 158, 160. This plane also coincides with the out-of-plane image plane of the coupling optics. A nearly circular waist (spot) that matches the fiber spot size is formed at this plane so that the light is efficiently coupled into the fiber 162.

Figure 21:
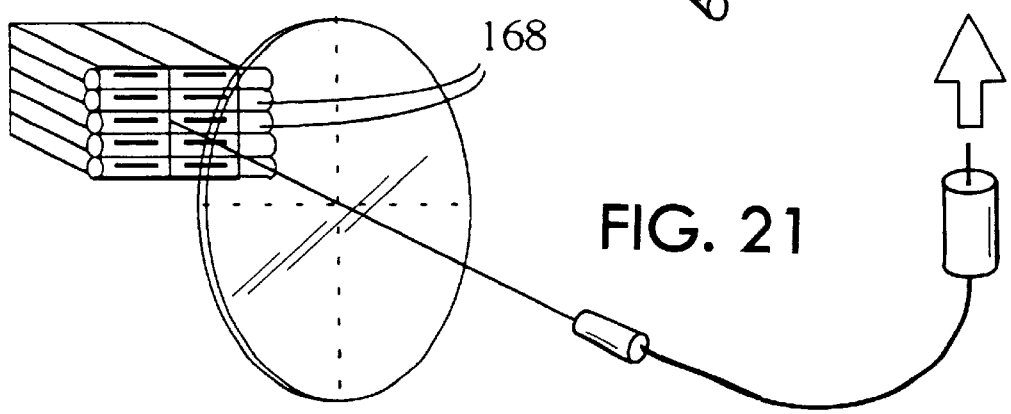

FIG. 21 is yet another embodiment similar to FIG. 20, but, as in the FIG. 18 embodiment, having the full-beam anamorphic component substituted by an array of anamorphic lenslets, one lenslet for each of the emitters in the two-dimensional stack of emitters constituting the micro laser means.

As described above, the external cavity micro laser apparatus according to the present invention has as an important aspect partial reflecting means located beyond the waveguide input aperture and constituting a boundary of the cavity for returning a predetermined fraction of the optical energy in the waveguide means to the laser means.

By returning a predetermined fraction of the optical energy in the waveguide to the laser means, selected lasing lobe components are mixed in the waveguide between the input aperture and the partial reflecting means such that the coherence and the imaging performance of the imaging means is improved.

Figure 21A:
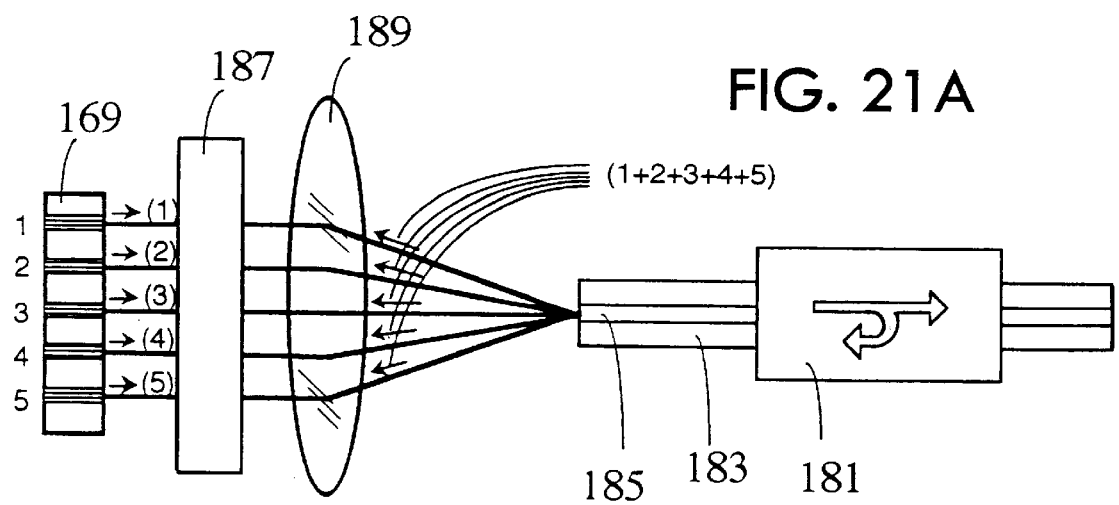
FIGS. 21A and 21B are tutorial views illustrating a mode mixing principle embraced by the present invention.
Figure 21B:
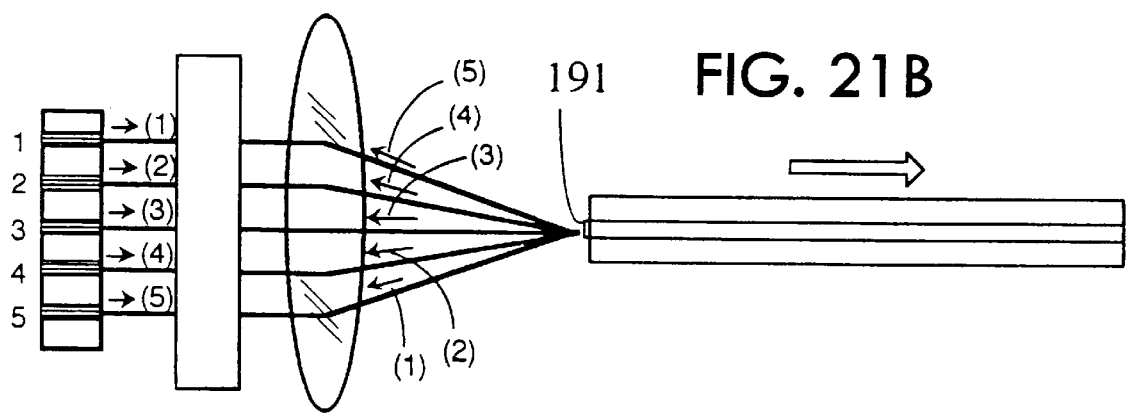

FIGS. 21A and 21B illustrate the improved mode mixing which results from an output coupler 169 placed beyond the input aperture of the fiber (FIG. 21A) compared to a partial reflector placed at the input face of the fiber (FIG. 21B). FIG. 21A illustrates a system similar to that in FIG. 20 comprising a microlaser 169 (here shown as an array of uncoupled emitters labeled 1–5), an output coupler 181, and a waveguide comprising cladding 183 and a core 185. Imaging means are shown in the form of an anamorphic lens 187 and a non-anamorphic lens 189.

FIG. 21B differs from FIG. 21A in that the output coupler 181 is eliminated and the input aperture of the fiber core 185 has on its face a partial reflector 191. In FIGS. 21A and 21B the waveguide is shown as an optical fiber, by way of example. The partial reflector 191 in FIG. 21B is assumed to have the same size and shape as the fiber core. The fiber is assumed to have a numerical aperture sufficiently high to accept light even from the extreme emitters 1 and 5. A single mode fiber and fundamental mode excitation are assumed in this example.

In FIG. 21A, since the feedback is coming within the fiber, light from individual emitters are indistinguishable in terms of propagation direction. Hence, each emitter sees light from all other emitters which makes it easier for all of the emitters to lock in phase to a single common frequency. However, in FIG. 21B, if we were to take the feedback right from the fiber emission aperture using an apertured mirror, perfect mode mixing is not possible. The laws of reflection (incident ray and reflected ray makes same angle with the normal) favors emitter 1 to be coupled to emitter five and visa versa more strongly than their coupling to other emitters. Similarly, emitters 2 and 4 couple strongly to each other and weakly to others. Because of the symmetry, emitter 3 couples back to itself strongly and weakly with others. Hence the emitters in FIG. 21B do not communicate among one another as effectively as the emitters do in FIG. 21A and therefore the coherence performance will be inferior.

Figure 22:
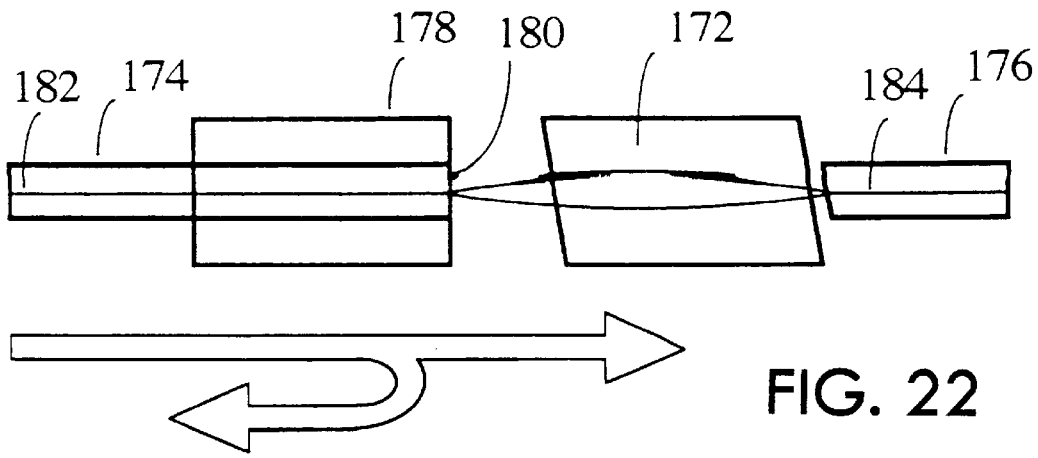
FIGS. 22–28 illustrate various arrangements by which a fraction of output laser energy is returned to the micro laser for regeneration.

A few of the many available structures for accomplishing the partial reflection of optical energy to the laser means will now be described. An output coupler arrangement is illustrated in FIG. 22 as comprising a lens 172 (here shown by way of example as a graded index lens) disposed in a break between a first length 174 of optical waveguide receiving optical energy from a laser, and a second length 176 of optical waveguide. A ferrule 178 terminates the fiber length 174. In the FIG. 22 embodiment, the partially reflective surface is a cleaved and polished surface 180 which will provide, for example, approximately 4% Fresnel back reflection. The surface 180 may contain a reflection coating to achieve any desired level of reflectivity.

The lens 172 which may be collects the light from the waveguide core 182 within waveguide length 174 and focuses it into the core 184 of fiber length 176.

Figure 23:
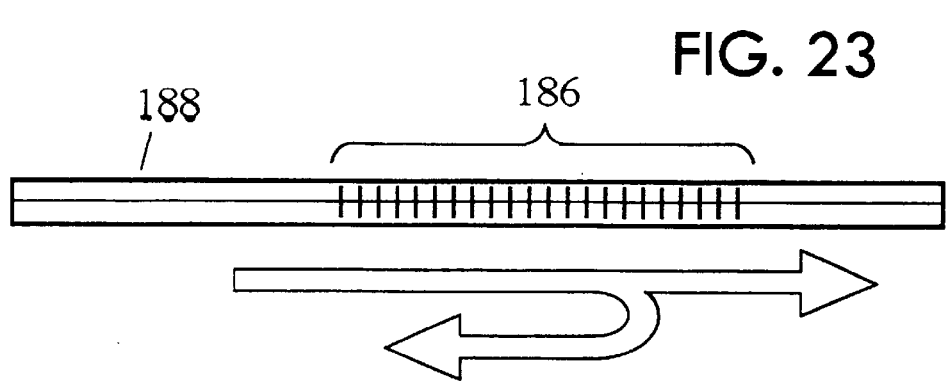

FIG. 23 illustrates an output coupler arrangement wherein the partially reflecting means provides a Bragg grating 186 in the waveguide 188. The Bragg grating 186 may be written on the core of a silica-based fiber using a high power ultraviolet source such as an excimer laser. A Bragg grating 186 can be designed to have back reflectivities ranging from a few percent to 99 percent, and a wavelength reflection band from 0.1 nanometers to several nanometers on any desired wavelength.

Figure 24:
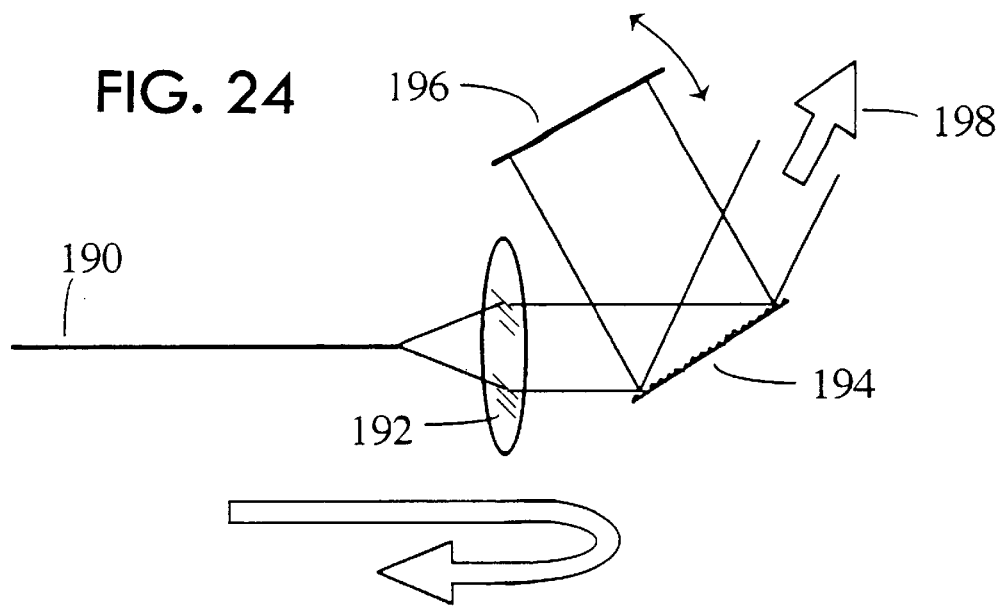

In an output coupler alternative illustrated in FIG. 24, laser light in waveguide 190 is collimated by a lens arrangement 192 and frequency dispersed by a grating 194. A mirror 196 returns incident laser light to the optical waveguide 190 for return to the laser means. The band of optical frequencies desired to be returned to the laser means and amplified is selected by adjusting the tilt angle of the mirror 196. The main optical output from the system is indicated at 198.

Figure 25:
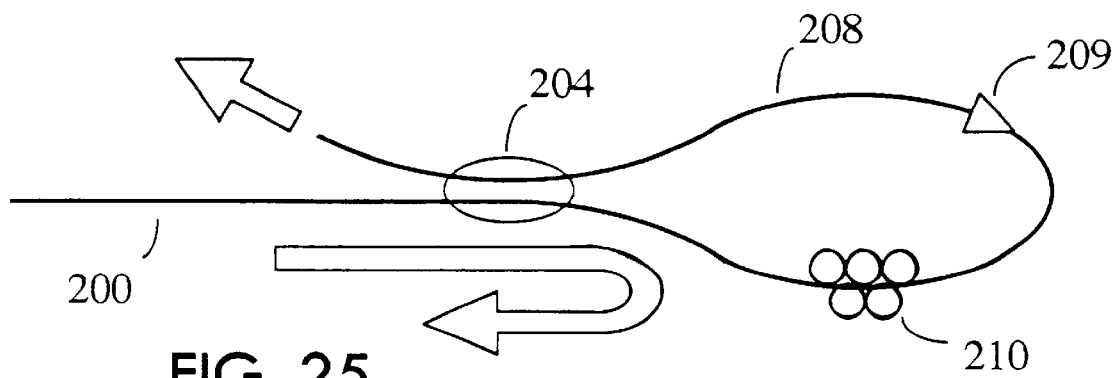

Yet another optical coupler arrangement is shown in FIG. 25 wherein an optical waveguide 200 is looped back upon itself to form a non-linear or linear "Sagnac" reflector serving as the partial reflecting means.

The FIG. 25 optical coupler includes in the region of the loop 208 a polarization controller 210 for controlling the predetermined fraction of laser energy returned to the laser means and its plane of polarization. Also, the FIG. 25 optical coupler may include an optional optical isolator 209 for eliminating any interference effects of the clockwise and counter clockwise beams in the loop 208.

Figure 26:
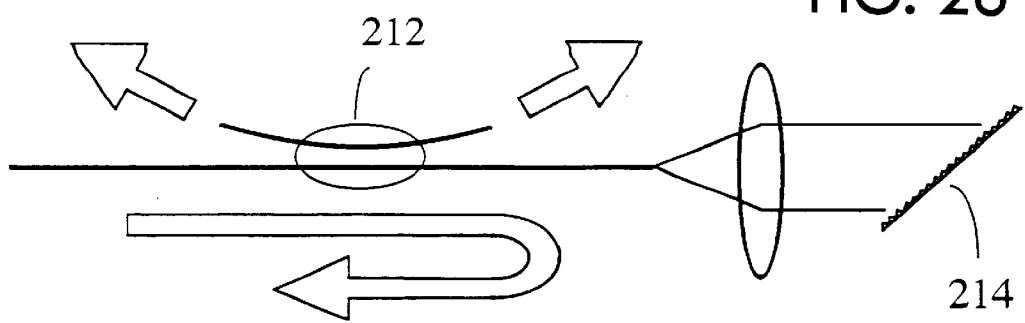

FIG. 26 depicts yet another optical coupler geometry which combines certain of the features in FIGS. 24 and 25 couplers. The FIG. 26 arrangement includes both a fiber coupler 212 and a grating 214, preferably of the Littrow type. The fiber coupler 212 provides alternative outputs from the system. The predetermined fraction of laser energy which is returned to the laser means is determined by the properties of the fiber coupler 212 and the diffraction efficiency of the grating 214.

Figure 27:
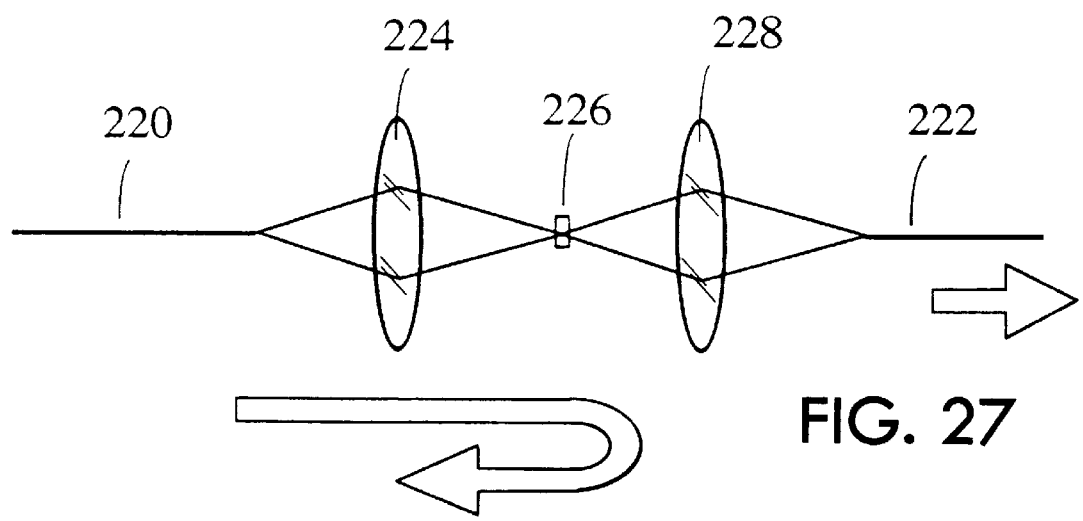

FIG. 27 illustrates an optical coupler arrangement in which an output optical waveguide is divided into a first length 220 and a second length 222. A lens 224 collects light from the first length of fiber 220 and focuses it upon a saturable absorber 226. A second lens 228 collects light modified by the absorber 226, and focuses it into the input aperture of the second length 222 of optical waveguide. As explained elsewhere herein, pulse shaping can be accomplished in any of the geometries described herein, using any of the well-known pulse-shaping techniques. A saturable absorber is but one of a number of devices and techniques which may be utilized to accomplish pulse shaping.

Figure 28:
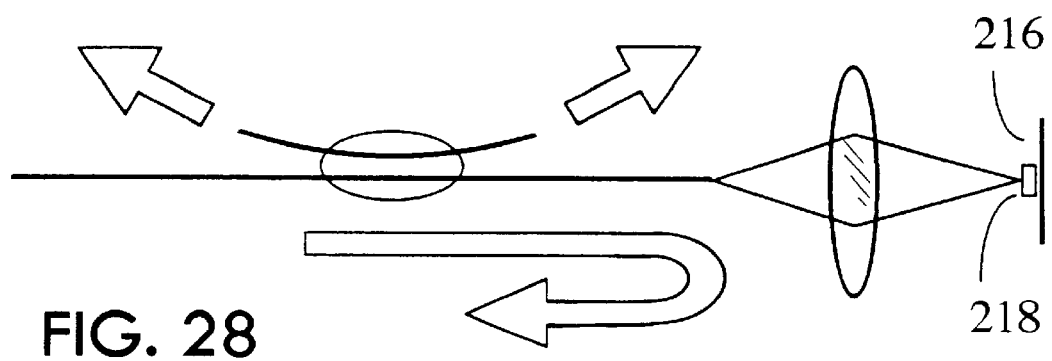

FIG. 28 illustrates an alternative optical coupler arrangement which is similar to that shown in FIG. 27, with a high reflection mirror 216 substituted for the grating 214 in the FIG. 26 embodiment. To again illustrate that pulse shaping can be accomplished in any of the geometries described herein, a saturable absorber is illustrated at 218, disposed adjacent the plane of the mirror 216.

Thus, in accordance with the present invention there is provided external cavity micro laser apparatus in which a self mode-discriminating waveguide-coupled mode-matched cavity extracts high brightness laser light from multimode micro laser arrangements which may comprise either a single emitter, a linear array of emitters, or a two-dimensional stack of emitters. The present invention does not require a precisely aligned spatial-filtering stripe mirror as in certain prior art geometries or a spatial filtering mirror edge for mode discrimination. The input aperture of the coupled waveguide is placed at the spatial filtering plane of the micro laser and is used as the mode-discriminating element. Feedback reflection from inside the fiber core acts as the mode discriminating feedback necessary to extract high brightness power from the micro laser. The present invention is insensitive to beam steering as laser drive current is varied in the micro laser, and is capable of phase locking uncoupled micro laser emitters.

Figure 29:
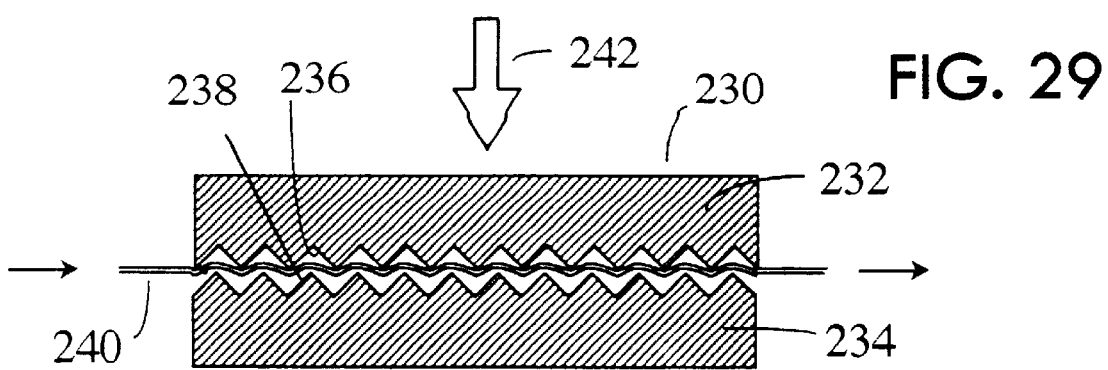
FIG. 29 schematically depicts a mode scrambler useful in the practice of the present invention.

Other modifications and embodiments of the invention may be apparent to those skilled in the art in view of the foregoing description. This description is to be construed as illustrative only and is for the purpose of teaching those skilled in the art the best modes for carrying out the invention. By way of example, mode scrambling means may be located in advance of the waveguide input aperture to enhance the mixing of the spatial modes of the waveguide means. FIG. 29 illustrates mode scrambling means in the form of a periodic micro-bend generator 230. The micro-bend generator 230 comprises micro-bend inducers 232, 234 having internal serrations 236, 238, respectively, which capture an optical waveguide, here shown as an optical fiber 240.

At each micro-bend site, a fraction of the power in one mode is radiated (coupled) to other modes. Also some power is radiated out (coupled to radiation modes) and thus lost from the fiber core. By applying an appropriate small pressure in the direction shown by arrow 242 between the micro-bend inducers 232, 234, the severity of the micro bend in the fiber 240 can be adjusted and thus the mode mixing optimized with a tolerable radiation loss.

In the multimode fiber case, it may be especially desirable to have a mode scrambler for improved performance. In all of the embodiments discussed herein, an optical isolator located after the optical coupler (outside the cavity) improves the performance, as any unwanted reflections coming from beyond the output coupler are effectively isolated or attenuated.

Figure 30:
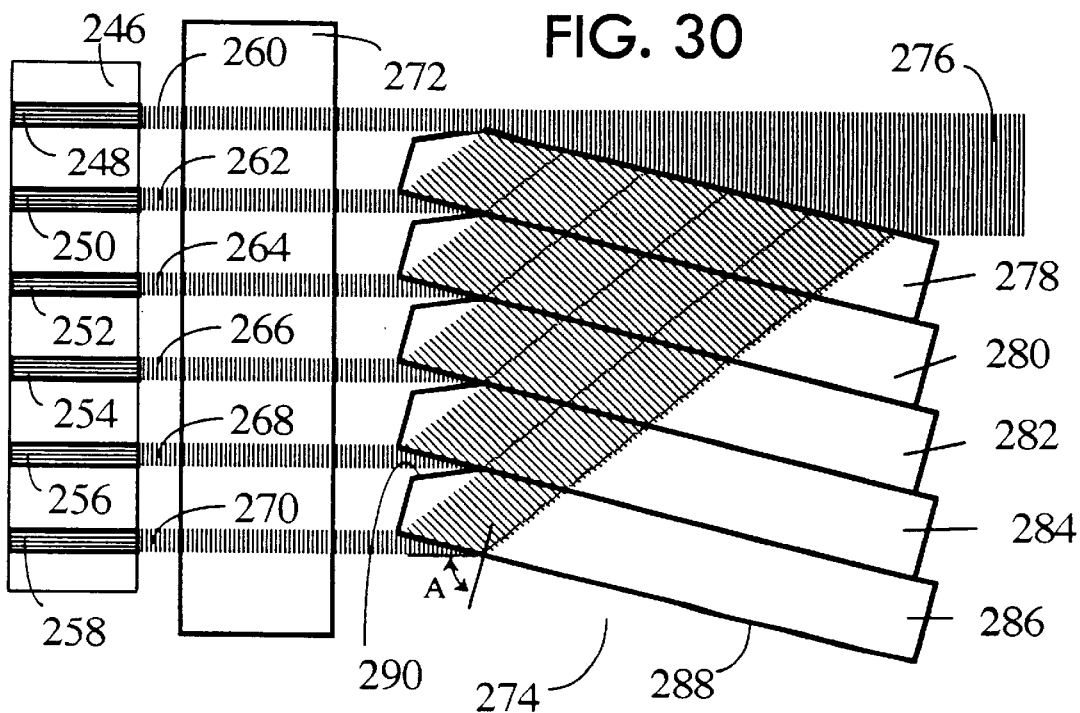
FIGS. 30–33 depict various beamlet despacing arrangements according to the present invention.

Yet another modification of the invention is illustrated in FIG. 30. FIG. 30 illustrates micro laser apparatus comprising a laser array 246 having a plurality of spaced laser emitters 248, 250, 252, 254, 256, and 258 arranged in a linear array along a slow axis of the laser array 246. The emitters emit a like plurality of laterally spaced parallel beamlets 260, 262, 264, 266, 268, and 270.

An anamorphic lens means 272 is provided for collimating the beamlets in the fast axis direction (perpendicular to the plane of FIG. 30).

Despacing means 274 optically coupled to the laser array 246 is provided to reduce the spacing between the beamlets while preserving their parallelism to form a more tightly bundled output beam 276.

In the FIG. 30 embodiment of the invention the despacing means 274 comprises a parallel arrangement of beamlet-translation elements, which may, for example, comprise a stack of slides (glass, e.g.) 278, 280, 282, 284 and 286 of a number at least equal to N minus one, wherein N is the number of emitters. Each of the slides is arranged at a common angle with respect to its respectively associated beamlet, the slides being constructed and arranged to progressively offset the beamlets into a state of contiguous parallelism. In a preferred arrangement, the angle "A" subtended by a normal to be impinged surface of the slide (for example, surface 288 on slide 286) and the impinging beamlet (268 in the case of the slide 286) is the Brewster angle.

In the preferred arrangement illustrated in FIG. 30, each of the slides has a beveled front face effective to prevent interference with an adjacent beamlet. In FIG. 30, this beveled surface on slide 288, for example, is indicated at 290.

Figure 31:
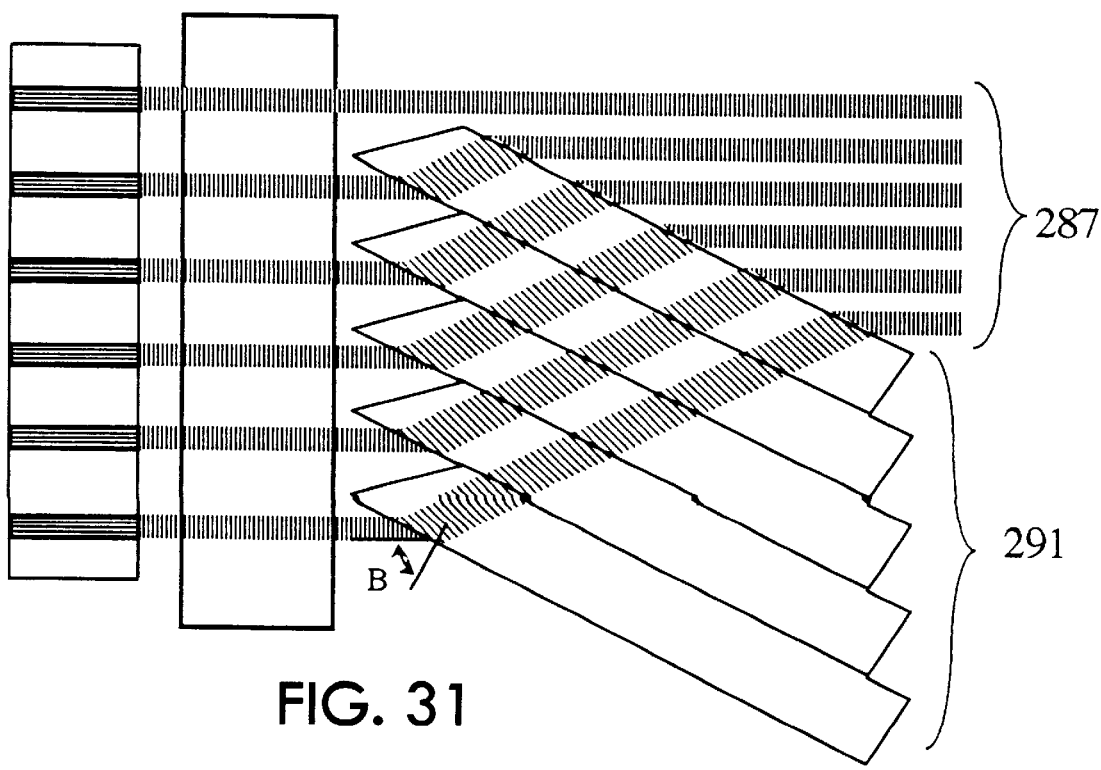
Figure 32:
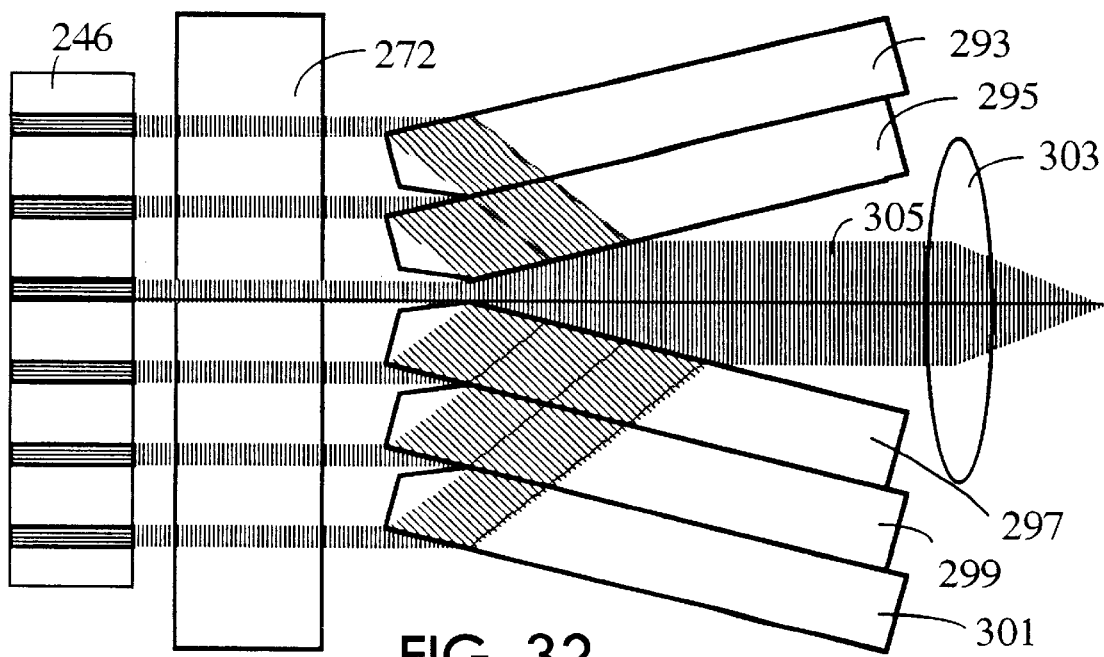

FIG. 31 depicts an alternative form of the afore-discussed despacing means according to the invention. The FIG. 31 arrangement is similar to the FIG. 30 embodiment except that the slides, numbered collectively 291, have an angle "B" and a fully beveled front face 289. The FIG. 31 embodiment produces output beamlets 287 which are parallel and contiguous but not completely merged, as in the FIG. 30 embodiment. FIG. 32 depicts despacing means similar to that shown in FIG. 30, except that beam-translation elements—again here shown by way of example as slides 293, 295—are inverted in a mirror image relationship to slides 297, 299, and 301 such that the resulting merged output beam 305 is more nearly centered relative to the laser array 246 than is the case in the FIG. 30 embodiment.

Figure 33:
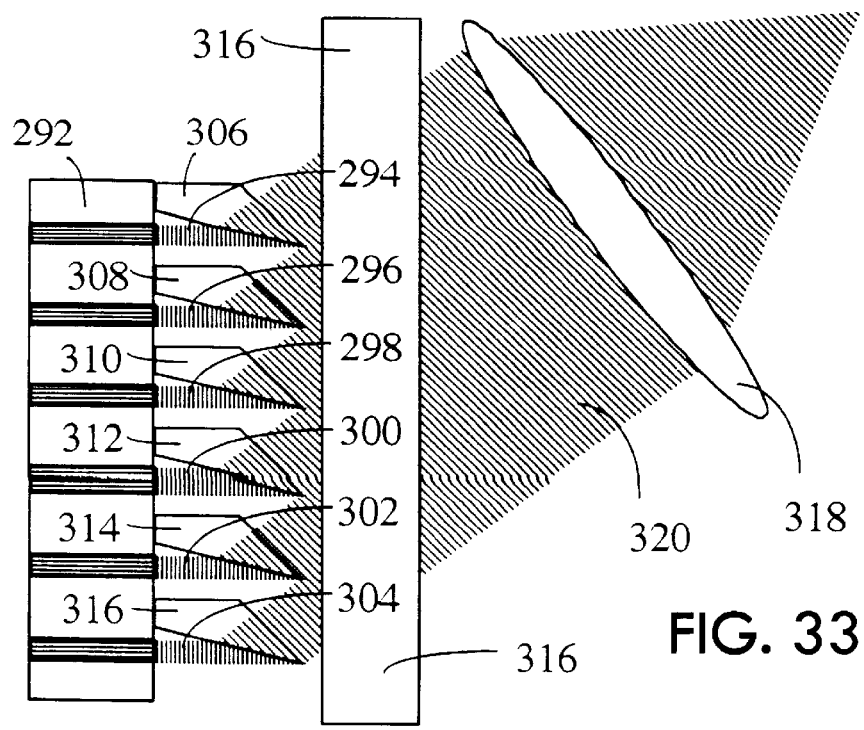

FIG. 33 illustrates yet another embodiment of the afore-described despacing means. FIG. 33 illustrates micro laser apparatus comprising a laser array 292 similar to the laser array 246 illustrated in FIG. 30, producing parallel beamlets 294, 296, 298, 300, 302, and 304. The FIG. 33 embodiment of the despacing means includes a number of prisms 306, 308, 310, 312, 314, and 316 respectively associated with the emitters producing the beamlets. The prisms are constructed and arranged to redirect the respectively associated beamlets into a state of contiguous parallelism in an output beam 320.

An anamorphic lens means 316 collimates the beamlets in the fast axis direction. A non-anamorphic lens 318 may couple the output beam into the input aperture of an optical waveguide.

As noted, it should be understood that features detailed with respect to one or more of the above-described embodiments (for example pulse shaping and optical frequency selection) may be employed in other embodiments in which that particular feature may not have been discussed For example, any of the afore-described embodiments may be provided with pulse shaping, as by the use of a saturable absorber, or with frequency selection capability by the use of a frequency dispersing element combined with a frequency selection means.

The imaging elements illustrated, whether refractive or reflective, may be provided with correction of spherical aberration or other aberrations. As described, in any of the embodiments discussed, and others which are within the spirit and scope of the present invention, the micro laser means may take the form of a single emitter, a linear (one-dimensional) array of emitters, or a two-dimensional stack of emitters.

The details of the structure of the present invention may thus be varied substantially without departing from the spirit of the invention, and exclusive use of all modifications which come within the scope of the appended claims is reserved.

What is claimed is:

1. External cavity micro laser apparatus, comprising:
at least one multimode micro laser means having an emission aperture with a relatively long dimension lying in a slow axis plane and a relatively short dimension lying in a fast axis plane, said laser means producing multiple transverse lasing modes, said multiple modes having multiple lasing lobe components; and
external cavity means embracing said laser means and comprising:
an output section having an output beam, said output section including:
spatial filter means for effectively selecting at least one of said transverse lasing lobe components;
imaging means for imaging at said spatial filter means a far field spatial frequency distribution of said emission aperture in the slow axis plane, at which said lasing lobe components are spatially distinguishable; and
feedback means distinct from and located beyond said spatial filter means for causing a fraction of the optical energy in said selected lasing lobe components to be fed back to said laser means for amplification by said laser means; and
a return section receiving said amplified lasing lobe component after reflection from said laser means, said return section including return means for efficiently returning to said laser means at least a portion of said amplified and reflected lasing lobe component.

2. The apparatus defined by claim 1 which includes optical waveguide means having cladding and a core with an input aperture, and wherein said input aperture constitutes said spatial filter means.

3. The apparatus defined by claim 2 including mode scrambling means located in advance of said input aperture for mixing the spatial modes of the waveguide means.

4. The apparatus defined by claim 2 wherein said feedback means comprises partially reflective means disposed beyond said input aperture.

5. The apparatus defined by claim 4 wherein said input aperture is sized and positioned to select a predetermined plurality of said transverse modes and said modes are mixed within said optical waveguide before being fed back to said laser means by said partially reflective means in order to improve the spatial coherence of the optical energy in said output section.

6. The apparatus defined by claim 4 wherein said partially reflecting means comprises a cut and polished terminal surface on said waveguide means.

7. The apparatus defined by claim 4 wherein said partially reflecting means comprises a Bragg grating in said waveguide means.

8. The apparatus defined by claim 4 wherein said partially reflecting means comprises a frequency-dispersive grating and a reflector for reflecting laser energy received from said grating back to said grating for return to said laser means.

9. The apparatus defined by claim 4 wherein said waveguide means is looped back upon itself to form a Sagnac reflector loop serving as said partial reflecting means.

10. The apparatus defined by claim 9 wherein said apparatus includes a polarization controller located in the region of said loop for controlling said predetermined fraction of laser energy returned to said laser means and its plane of polarization.

11. The apparatus defined by claim 4 wherein said partially reflecting means is wavelength selective and comprises a directional waveguide coupler on said waveguide means followed in said waveguide means by wavelength-selective grating means which returns light in a selected band of frequencies back to said laser means.

12. The apparatus defined by claim 4 wherein said partially reflecting means comprises pulse-shaping means located in said laser energy, said pulse-shaping means reflecting said predetermined fraction of laser energy from a back surface thereof.

13. The apparatus defined by claim 4 wherein said partially reflecting means is wavelength selective and comprises a fiber coupler on said waveguide means followed in said waveguide means by pulse-shaping means and mirror means which returns pulse-shaped laser energy to said laser means.

14. The apparatus defined by claim 1 wherein said output beam cross-section distribution has a high aspect ratio and said input aperture is more circularly symmetric, and wherein said imaging means has an anamorphic component for reshaping said output beam to better conform to said input aperture.

15. The apparatus defined by claim 14 wherein said anamorphic component is effective at least in said output section.

16. The apparatus defined by claim 14 wherein said anamorphic component is effective in both said output section and said return section of said external cavity.

17. The apparatus defined by claim 14 wherein said anamorphic component is effective only in said output section of said external cavity.

18. The apparatus defined by claim 14 including crossed cylindrical lens means of different power.

19. The apparatus defined by claim 1 wherein said return section of said external cavity includes mirror means.

20. The apparatus defined by claim 19 which includes optical waveguide means having cladding and a core with an input aperture, wherein said input aperture constitutes said spatial filter means, and wherein said mirror means is contiguous to said input aperture.

21. The apparatus defined by claim 20 wherein said waveguide means includes said mirror means.

22. The apparatus defined by claim 20 including a ferrule which captures said waveguide means, and wherein a portion of an end surface of said ferrule spaced from said input aperture defines said mirror means.

23. The apparatus defined by claim 19 wherein said mirror means is planar.

24. The apparatus defined by claim 19 wherein said mirror means has imaging properties.

25. The apparatus defined by claim 1 wherein said apparatus includes means for frequency dispersing the optical energy in said external cavity and for selecting a predetermined band of lightwave frequencies in the dispersed optical energy.

26. The apparatus defined by claim 1 wherein said apparatus includes pulse shaping means located in said external cavity.

27. External cavity micro laser apparatus, comprising: multimode micro laser means having an emission aperture and producing an output beam having a fundamental mode and multiple transverse lasing modes having a plurality of lasing lobe components; and optical waveguide means having a cladding and a core with an input aperture, said input aperture receiving said output laser beam from said laser means; imaging means laterally spaced from said input aperture receiving said output beam and imaging at said input aperture a far field spatial frequency distribution of said emission aperture in the slow axis plane, at which distribution said lasing lobe components are spatially distinguishable, said input aperture being sized and positioned to select one or more predetermined lasing lobe components; and partial reflecting means after said input aperture for returning a predetermined fraction of the optical energy in said waveguide means to said laser means, selected lasing lobe components mixing in said waveguide between said input aperture and said partial reflecting means such that the coherence of the output beam is thereby improved.

28. The apparatus defined by claim 27 wherein said laser means comprises a two-dimensional matrix of emitters.

29. The apparatus defined by claim 27 wherein said output beam cross-section has a high aspect ratio and said input aperture is more circularly symmetric, and wherein said imaging means has an anamorphic component for reshaping said output beam to better conform to said input aperture.

30. Micro laser apparatus, comprising: multimode micro laser means having an emission aperture and producing an output beam having a fundamental mode and multiple transverse lasing modes having a plurality of lasing lobe components; optical waveguide means having an input aperture; and imaging means for imaging at said input aperture a far field spatial frequency distribution of said emission aperture in a slow axis plane of the laser means, at which distribution said lasing lobe components are spatially distinguishable, said input aperture being sized and positioned to select one or more predetermined lasing lobe components; said optical waveguide means having a cladding and having a core with said input aperture, said input aperture receiving an output laser beam from said laser means and having laterally spaced therefrom mirror means for retuning back to said laser means laser energy which has been reflected from said laser means.

31. The apparatus defined by claim 30 wherein said output beam cross-section has a high aspect ratio and said input aperture is more circularly symmetric, and wherein said imaging means has an anamorphic component for reshaping said output beam to better conform to said input aperture.

32. The apparatus defined by claim 31 wherein said imaging means comprises an anamorphic lens and a non-anamorphic lens.

33. The apparatus defined by claim 31 wherein said imaging means comprises crossed anamorphic lenses.

34. The apparatus defined by claim 33 wherein said imaging means comprises crossed cylinder lenses.

35. The apparatus defined by claim 30 wherein said waveguide means is sized and positioned such that said input aperture selects said fundamental lasing lobe component.

36. The apparatus defined by claim 30 wherein said waveguide means is sized and positioned to select a plurality of said transverse lasing lobe components.

37. The apparatus defined by claim 30 wherein said laser means comprises a two-dimensional matrix of emitters.

38. The apparatus defined by claim 27 wherein said partial reflecting means comprises a cut and polished terminal surface on said waveguide means.

39. The apparatus defined by claim 27 wherein said partial reflecting means comprises a Bragg grating in said waveguide means.

40. The apparatus defined by claim 27 wherein said partial reflecting means comprises a frequency-dispersive grating and a reflector for reflecting laser energy received form said grating back to said grating for return to said laser means.

41. The apparatus defined by claim 27 wherein said waveguide means is looped back upon itself to form a Sagnac reflector loop serving a said partial reflector means.

42. The apparatus defined by claim 41 wherein said apparatus includes a polarization controller located in the region of said lop for controlling said predetermined fraction of laser energy returned to said laser means and its plane of polarization.

43. The apparatus defined by claim 27 wherein said partial reflecting means is wavelength selective and comprises a directional waveguide means followed in said waveguide means by wavelength-selective grating means which returns light in a selected band of frequencies back to said laser means.

44. The apparatus defined by claim 27 wherein said partial reflecting means comprises pulse-shaping means located in said laser energy, said pulse-shaping means reflecting said predetermined fraction of laser energy from a back surface thereof.

45. The apparatus defined by claim 27 wherein said partial reflecting means is wavelength selective and comprises a fiber coupler on said waveguide means followed in said waveguide means by pulse-shaping means and mirror means which returns pulse-shaped laser energy to said laser means.

46. The apparatus defined by claim 30 including mode scrambling means located in advance of said input aperture for mixing the spatial modes of said waveguide means.

47. External cavity micro laser apparatus, comprising: multimode micro laser means producing output laser energy; an external cavity including said laser means and having first and second reflective means defining the boundaries of the cavity; optical waveguide means having an input aperture; imaging means for converging said output laser energy into said input aperture of said waveguide means; and partial reflecting means located beyond said input aperture and constituting said second reflective means for returning a predetermined fraction of the optical energy in said waveguide means to said laser means, wherein said partial reflecting means is wavelength selective and comprises a directional waveguide coupler coupled into said waveguide means followed in said waveguide means by wavelength-selective grating means which returns light in a selected band of frequencies back to said laser means.

48. External cavity micro laser apparatus, comprising: multimode micro laser means producing output laser energy; an external cavity including said laser means and having first and second reflective means defining the boundaries of the cavity; optical waveguide means having an input aperture; imaging means for converging said output laser energy into said input aperture of said waveguide means; and partial reflecting means located beyond said input aperture and constituting said second reflective means for returning a predetermined fraction of the optical energy in said waveguide means to said laser means, wherein said partial reflecting means comprises pulse-shaping means located in said laser-energy, said pulse-shaping means reflecting said predetermined fraction of laser energy from a back surface thereof.

49. External cavity micro laser apparatus, comprising: multimode micro laser means producing output laser energy; an external cavity including said laser means and having first and second reflective means defining the boundaries of the cavity; optical waveguide means having an input aperture; imaging means for converging said output laser energy into said input aperture of said waveguide means; and partial reflecting means located beyond said input aperture and constituting said second reflective means for returning a predetermined fraction of the optical energy in said waveguide means to said laser means, wherein said partial reflecting means is wavelength selective and comprises a fiber coupler on said waveguide means followed in said waveguide means by pulse-shaping means and mirror means which returns pulse-shaped laser energy to said laser means.

50. External cavity micro laser apparatus, comprising: multimode micro laser means producing output laser energy; an external cavity including said laser means and having first and second reflective means defining the boundaries of the cavity; optical waveguide means having an input aperture; imaging means for converging said output laser energy into said input aperture of said waveguide means; and partial reflecting means located beyond said input aperture and constituting said second reflective means for returning a predetermined fraction of the optical energy in said waveguide means to said laser means, and mode scrambling means located in advance of said input aperture for mixing the spatial modes of the waveguide means.

51. External cavity laser apparatus, comprising: a multimode micro laser means for generating an output laser beam, an optical waveguide means having cladding and a core and having waveguide input means comprising a core input aperture for receiving said output laser beam and having laterally spaced therefrom mirror means for returning back to said laser means laser energy which has been reflected from said laser means.

52. The apparatus defined by claim 51 wherein an input termination of said optical waveguide means is captured in a ferrule which has a dual facet chisel-shaped termination with said core input aperture being located in one facet slightly offset from an edge formed at the convergence of said facets.

53. The apparatus defined by claim 52 wherein said one facet has a slope angle substantially equal to the Brewster angle.

54. The apparatus defined by claim 53 including means for utilizing light reflected off said one facet to monitor the location or other parameter of the output beam.

55. The apparatus defined by claim 52 wherein a wedge is positioned on the other of said dual facets and has a reflective surface constituting said mirror means.

56. The apparatus defined by claim 51 wherein said optical waveguide means has at its termination a facet sloping away from said laser means, said core input aperture being located in said sloping facet.

57. The apparatus defined by claim 56 wherein said facet has a slope angle substantially equal to the Brewster angle.

58. The apparatus defined by claim 56 including means for utilizing light reflected off said facet to monitor the location or other parameter of the output beam.

59. The apparatus defined by claim 51 wherein an end portion of said waveguide means is captured in a ferrule, and wherein a portion of an end surface of said ferrule spaced from said core input aperture defines said mirror means.

60. The apparatus defined by claim 51 wherein said mirror means comprises a discrete reflector contiguous to said fiber.

61. The apparatus defined by claim 51 wherein said waveguide input means includes mode scrambling means located in advance of said input aperture for mixing the spatial modes of the waveguide means.

* * * * *